(12) United States Patent
Bruwer et al.

(10) Patent No.: US 9,496,793 B2
(45) Date of Patent: Nov. 15, 2016

(54) CAPACITIVE SENSING ENABLED SWITCH MODE POWER SUPPLY AND DATA TRANSFER

(71) Applicants: Frederick Johannes Bruwer, Paarl (ZA); Daniel Van Wyk, Paarl (ZA); Willem Adriaan Doorduin, Paarl (ZA)

(72) Inventors: Frederick Johannes Bruwer, Paarl (ZA); Daniel Van Wyk, Paarl (ZA); Willem Adriaan Doorduin, Paarl (ZA)

(73) Assignee: AZOTEQ (PTY) LTD, Paarl (ZA)

( * ) Notice: Subject to any disclaimer, the term of this patent is extended or adjusted under 35 U.S.C. 154(b) by 282 days.

(21) Appl. No.: 14/355,564

(22) PCT Filed: Oct. 31, 2012

(86) PCT No.: PCT/ZA2012/000082
§ 371 (c)(1),
(2) Date: Apr. 30, 2014

(87) PCT Pub. No.: WO2013/067550
PCT Pub. Date: May 10, 2013

(65) Prior Publication Data
US 2014/0253032 A1    Sep. 11, 2014

(30) Foreign Application Priority Data

| Nov. 1, 2011 | (ZA) | 2011/08011 |
| Feb. 3, 2012 | (ZA) | 2012/00834 |
| Feb. 21, 2012 | (ZA) | 2012/01265 |
| Apr. 5, 2012 | (ZA) | 2012/02533 |
| Jun. 1, 2012 | (ZA) | 2012/04115 |
| Jun. 13, 2012 | (ZA) | 2012/04325 |
| Jul. 19, 2012 | (ZA) | 2012/05397 |

(51) Int. Cl.
*H02M 3/335* (2006.01)
*H02M 1/36* (2007.01)
(Continued)

(52) U.S. Cl.
CPC ...... *H02M 3/33507* (2013.01); *G01R 27/2605* (2013.01); *H02J 7/025* (2013.01);
(Continued)

(58) Field of Classification Search
CPC .... H02M 3/33507; H02M 1/36; H02J 7/025; H05B 33/0815; H05H 7/02; H05H 7/22; H05H 9/041; H05H 9/045; H05H 9/047; H05H 13/04
USPC .......................................................... 315/291
See application file for complete search history.

(56) References Cited

U.S. PATENT DOCUMENTS

| 4,211,959 A * | 7/1980 | Deavenport | ............ F21V 23/04 |
| | | | 200/600 |
| 2009/0315850 A1* | 12/2009 | Hotelling | .............. G06F 3/0418 |
| | | | 345/173 |

(Continued)

*Primary Examiner* — Dylan White
(74) *Attorney, Agent, or Firm* — William A Blake

(57) ABSTRACT

A microchip for control of a switch mode power supply (SMPS), with said microchip also having the ability to measure capacitance of an electrode or sense plate structure or structures, and use of a low power, power supply structure to supply said microchip, said power supply structure distinct from the main energy path via said SMPS to a load. The microchip may control said SMPS to transition between an active state and an inactive state, with the measured capacitance used to determine a condition for state transition. In said SMPS inactive state, only the microchip draws power to operate its capacitive sensing circuitry, leading to a significant SMPS standby losses decrease compared to prior art. Further teachings by the present invention include capacitive sensing based data transfer, universal charging platforms for mobile devices, noise immunity enhancements, various lighting embodiments as well as SMPS operation improvements.

19 Claims, 15 Drawing Sheets

(51) Int. Cl.
*H02J 7/02* (2016.01)
*H05B 33/08* (2006.01)
*H05H 7/02* (2006.01)
*H05H 7/22* (2006.01)
*H05H 9/04* (2006.01)
*H05H 13/04* (2006.01)
*G01R 27/26* (2006.01)
*H05B 37/02* (2006.01)
*H02M 1/00* (2006.01)

(52) U.S. Cl.
CPC .......... *H02M 1/36* (2013.01); *H05B 33/0815* (2013.01); *H05B 37/02* (2013.01); *H02J 7/022* (2013.01); *H02M 2001/0006* (2013.01); *H02M 2001/0032* (2013.01); *Y02B 70/16* (2013.01)

(56) References Cited

U.S. PATENT DOCUMENTS

| | | | |
|---|---|---|---|
| 2010/0066679 A1* | 3/2010 | Pan | G06F 1/3203 345/166 |
| 2010/0097078 A1* | 4/2010 | Philipp | G06F 3/0418 324/684 |
| 2014/0180613 A1* | 6/2014 | Banhegyesi | G01R 22/065 702/61 |
| 2014/0239844 A1* | 8/2014 | Bruwer | H05B 33/0863 315/292 |
| 2014/0300274 A1* | 10/2014 | Acatrinei | H05B 33/0815 315/85 |

\* cited by examiner

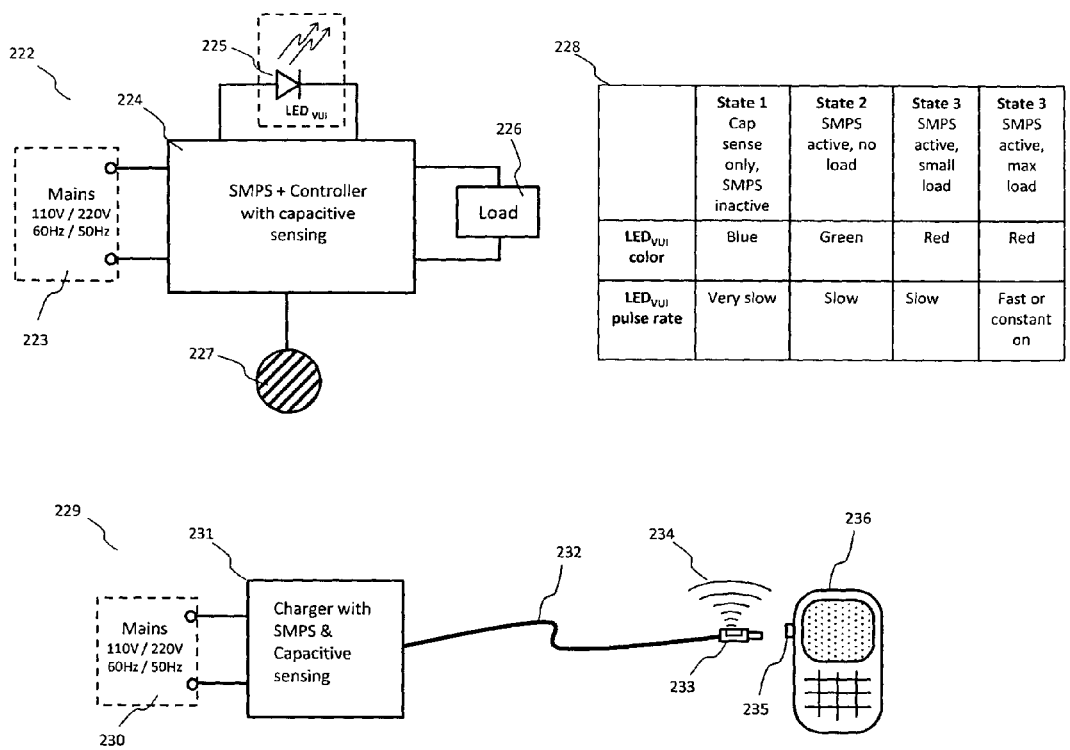
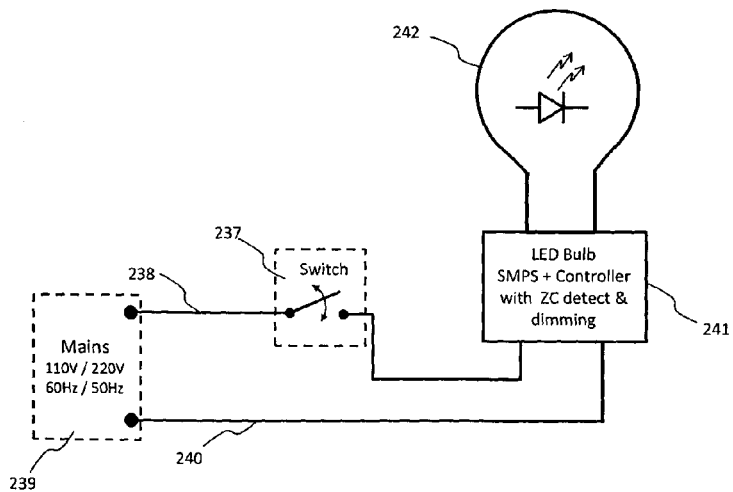
FIGURE 21
FIGURE 22

CAPACITIVE SENSING ENABLED SWITCH MODE POWER SUPPLY AND DATA TRANSFER

BACKGROUND OF THE INVENTION

The present invention pertains to switch mode power supplies and control thereof, and to the possible use of capacitive sensing to enable and/or improve such control.

ii.a) Standby Consumption of Power Electronics:

Power Electronics and switch mode power supplies have become a mature technology, and finds wide application in today's world. It is notable that almost all portable electronic devices contain some sort of Switch Mode Power Supply (SMPS). A typical example is shown in FIG. 1. Due to the fact that a SMPS typically exhibits high efficiency, it is attractive for mobile or portable electronic devices, as these normally run off batteries. Nonetheless, some losses are still incurred by these efficient switching circuits, which may be anything between a few and multiples of ten percent of the total energy processed and transferred to the load.

Mobile devices that employ SMPS often enter a low power mode after a specific period of inactivity, in order to conserve battery power. However, the SMPS will typically not join this entry into a low power mode, and as such, incur unnecessary losses. Often, the end device being powered by the SMPS has the ability to turn SMPS into low power state by deactivating an enable pin of the SMPS controller. But this action may result in an end device which is not powered anymore and consequently not being able to sense when a user require the system to power up again. Alternatively, the end device may be powered from an exhaustible supply, such as a capacitor, and periodically enable the SMPS when the exhaustible supply runs below a certain level. However, such a scheme may require an unnecessarily large low voltage energy store, and could be prone to reliability issues. Ideally, the microchip controlling the SMPS should have the ability to not only sense when the end device is in an inactive power state, and therefore enter the SMPS into a low power state as well, but also have the ability to sense when the whole system should be powered up again. In other words, it would be ideal if the SMPS controller has some inherent sensing ability for interaction with the user or other devices. An additional challenge is that the power-up sequence needs to be with as little delay as possible. By the time that the user touches the product containing the SMPS, it should be in maximum power transfer mode already. Therefore, some sort of proximity sensing would be beneficial, where a user's approach, or that of a legitimate engaging device, may be sensed, and timely action taken.

ii.b) Charging Mobile Devices:

Another notable aspect of modern life is the large number of portable electronics being charged every day. A typical user has a number of mobile electronic devices, each with its own specific charging requirements, and separate chargers. This results in quite a challenge to keep track of when each mobile device needs to be charged, what charger should be used, and the location of each charger. The prior art contains a number of solutions to address these problems, for instance as disclosed in U.S. Pat. No. 7,952,320 to Research In Motion, but to date, a simple, robust and cost-effective universal charging solution for portable electronic devices is still not widely available, possible due to lack of robust, low cost communication platforms and power consumption challenges.

ii.c) Capacitive Sensing:

Capacitive touch sensing is approaching maturity as a technology. The last two decades have seen wide deployment of capacitive sensing solutions in consumer electronics. However, the underlying premises of the technology is quite old. For instance, the prior art contain reference to a touch enabled lamp in U.S. Pat. No. 2,896,131 that dates back more than five decades. With the recent commercial acceptance of and opportunities for capacitive touch technology, advance has been rapid. The prior art now holds technology that allow detection of user proximity over significant distances, well beyond a few centimeters. Further, a resultant reduction in the cost of integrated capacitive sensing solutions has opened up new applications heretofore untapped. Sensitivity of cost effective capacitive sensing circuits have become high enough to allow accurate sensing even if complimentary dielectric probes or electrodes are not perfectly lined up, and some distance away.

ii.d) Digital Data Transfer:

Another sphere of endeavor which has grown at a tremendous pace in recent decades is digital data transfer, and specifically wireless data transfer. However, a number of challenges still hinder deployment in certain areas. Wireless transceivers tend to be fairly costly components, even in integrated circuit form. Care needs to be taken with relevant legal adherence during design. Emissions from wireless transceivers also tend to travel well beyond that which is intended, due to the nature of the technology, opening up to possibility of illegal reception and demodulation, often for criminal purposes. This necessitates the need for complex encryption of data whenever wireless data transfer is used for secure transactions.

To facilitate data transfer over short distances, such as required in access control, a large number of HF solutions have been developed. Mostly, these are based on inductive energy transfer at a few MHz, used to power an access card, followed by an authentication transaction between reader and card. However, a fair amount of energy is required to transfer the energy inductively. Therefore, the reader can never enter a truly low power state, as it needs to be able to recognize a valid card approach or presence to wake from such a low power state, and this ability requires a fair amount of power.

ii.e) Noise Immunity of Capacitive Sensing:

In capacitive sensing applications, noise may present implementation and utilization challenges, due to the highly sensitive circuits used to sense changes in capacitance. Specifically common mode noise, or noise currents that flow to the electrical earth, can be detrimental to capacitive sensing systems, given that capacitive sensing electrodes always couple with said earth, be it intentional, as with self-capacitance measurements, or unintentional, as with mutual capacitance measurements. International Electromagnetic Compatibility (EMC) standards stipulate immunity to common mode conducted noise in the band from 150 kHz to 80 MHz, or even 230 MHz, if the product is small enough. Especially the lower frequencies of this band coincide with typical charge transfer frequencies used for capacitive sensing, potentially causing problems. If charge is transferred to and from an unknown capacitor such as a touch electrode at only one frequency, common mode conducted noise at this frequency may disrupt the capacitive sensing process, leading to either the false annunciation of touch or proximity events or an inability to sense real touch or proximity events. The prior art have ventured to overcome this obstacle by capacitive sensing techniques based on some spread of the spectrum used. However, the amount of spread that can be realistically realized is limited, both from a hardware perspective, and by sensitivity for human touch, which seems to be optimum at charge transfer frequencies around 500 kHz to 1 MHz. Said techniques also qualify a touch or proximity event for the complete range of frequencies present in the spread, and not for a specific charge transfer frequency per se.

In another technique held by the prior art, [US 2009/031 5850 by Hotelling et al], the use of a number of discrete stimulus frequencies and filtering algorithms are taught to improve multi-touch detection along with noise immunity. The method disclosed by Hotelling et al is a simplified version of the spread spectrum approach. Specifically, the application discloses majority rules, median and average algorithms. In a majority rules algorithm with three discrete frequencies, the measured capacitance value is taken as the average of the two capacitance values which are closest to each other, with the third value seen as possibly corrupted by noise, and discarded of. In a median filter algorithm, the median capacitance value of the three is taken as the measured capacitance. An average filter algorithm is self-explanatory. Once the measured capacitance is obtained from the filter algorithm, it is used to determine whether a touch occurred or not. It should be made clear that said application does not test for a touch at each of the discrete stimulus frequencies, but tests for a touch on a single capacitance value resulting from the three discrete stimulus frequencies. Although the technique disclosed by said application may improve noise immunity, it is also quite possible for noise to actually change the majority rules, median or average filter derived capacitance value in such a way that a touch is falsely detected, and annunciated.

ii.f) Lighting Technology Challenges:

Lighting technology have also seen significant changes in recent times, with focus on energy efficiency relative to light output, as well as on lifetime of lighting elements. Incandescent light bulbs are very close to becoming relics of a bygone age, being first replaced by fluorescent bulbs, and lately by solid state LED bulbs. Given the particular power requirements of these latter two technologies, SMPS are often used with them to convert 50/60 Hz mains power to the correct power frequency and level. Traditionally, lighting fixtures have been switched on and off with wall based, or in-line, high voltage mechanical switch assemblies. However, as high technology proliferate, users are increasingly opting for more intelligent user interfaces, even for lamps. Touch and proximity sensing based user interfaces are ideal candidates for lighting control. However, if prior art SMPS controllers are used to power fluorescent or LED based lighting fixtures, the SMPS will have to be active continuously, to power said intelligent user interfaces. This will inevitably increase power wastage over that of a traditional mechanical switch implementation, negating some of the efficiency gains achieved through the use of LED or fluorescent technology. What is needed is a SMPS controller which do not require the SMPS to be active and switching to be able to power and monitor the intelligent user interface of a lighting fixture or application.

In lighting fixtures of the prior art, another drawback is the absolute nature of control, specifically that executed with round knobs traditionally used to dim light sources, or single touch sensor (TS) dimmers. Users have to move said knobs in exactly the same manner, and in the same direction to obtain the same dimming effect each time. This is also true for applications other than lighting, for instance where knobs are used to control speed of electrical motors, or volume of an audio system etc. Further, prior art control knobs suffer from the fact that they are difficult to locate in the dark, as is often the case when a lamp or lighting fixture needs to be turned on. It would be advantageous if a controlling knob with control parameters which are more relative in nature can be contrived. That is, a control knob which only depends on the end point relative to the starting point to determine control actions. Single TS dimmers suffer from the drawback that the achieved light level is fixed beforehand according to the time that the TS is engaged. That is, if a user touches said TS for a specific time, a specific light level will be achieved. Users have to carefully time their engagement with said TS to obtain a desired light level. This can be an inconvenience. A dimmer control, based on touch detection, with the dimming level independent of the period of user engagement, may improve the art. Having dimmer controllers with some kind of Find-In-The-Dark (FITD) functionality in conjunction with a touch interface may further improve the art.

Lighting prior art also holds a control method whereby the traditional main power switch of the lighting application is used to facilitate a dimming function. Circuitry between said main power switch and the light emitting element are used to detect a number of rapid openings and closures of said switch. A specific level of light is chosen through the execution of a specific number of rapid openings and closures. This method may also be used to select a certain color of light to be emitted. However, said method has the significant drawback that the user has to continuously and rapidly operate said main power switch for a fair number of open/close cycles. This may not be acceptable, from a user convenience point of view, or from a mains power switch lifetime viewpoint.

ii.g) SMPS Audible Noise:

In prior art SMPS supplies, audible noise being emitted by a transformer in the supply, due to switching, may be a nuisance to users. Said noise may also occur in lighting applications where dimming is executed by repetitively keeping the main switching element or elements turned off for one or a number of cycles, reducing the amount of energy transferred by said transformer. The art would benefit from a technique that minimize such audible emissions without a significant increase in the required controller and memory resources.

The invention to be disclosed purports to address the drawbacks of prior art technology as listed above. Specifically, without imposing a limit, it aims to present a possible solution which allows SMPS application with a reduction in overall losses, and a cost effective and robust method to transfer digital data over a barrier consisting of a plurality of dielectrics along with an increased immunity to conducted noise.

SUMMARY OF INVENTION iii.a) SMPS and Controller with Capacitive Sensing Ability:

The presently disclosed invention teaches the use of capacitive sensing in the control of the operating state of a Switch Mode Power Supply (SMPS), and the transitions to/from an active, full power transfer state, typically with maximum losses and a low power inactive state, typically with minimum losses, for example measured capacitance of an electrode or sense plate structure may be used to determine a condition for activation of said SMPS, with said SMPS used to process and transfer electrical energy for consumption by a product. For example said SMPS is used to energize a load with DC power. Further, said capacitive sensing circuitry may also be used to transfer data across a plurality of dielectric barriers, with said data that may or may not be used in the control of the SMPS. The term Switch Mode Power Supply is deemed equivalent in this disclosure to the term Converter, often used in power electronics literature and references.

A microchip may be used for both capacitive sensing and to control the SMPS, according to the present invention. In a first instance, the microchip may be supplied with power via an alternative high impedance energy path distinct from the main energy path through the SMPS. Said high impedance energy path supplying the microchip may for example be resistive, capacitive or inductive in nature, or a combination of the three. The present invention also teaches that more than one rectifying path may be used to minimize losses even further during the inactive state of said switch mode power supply. That is, a first rectifying path may be used to provide power for conversion by the switching section of the SMPS, and consumption by the main load. A second rectifying path is used to provide power to said microchip via a low power, power supply structure, wherein high impedances are placed on the mains side of the diodes in the second rectifying path, thereby causing most of the mains alternating current (AC) voltage to fall across said high impedances. In a preferred embodiment, the high impedances are provided by two capacitors in series with the diodes of said second rectifying path, one connected to the mains live voltage, and the other to the mains neutral voltage, and the mains voltage is sufficiently dropped over these capacitors. These are used to supply said microchip with a so-called cap-dropper supply. A resistor may be placed in series with said capacitors to improve immunity to fast high current surges. The present invention further teaches that a switching element, for example a transistor, may be used to regulate the low voltage direct current (DC) bus, said bus used to supply said microchip. This regulating transistor is effectively used to short-circuit the low AC-voltage present before the diodes of the second rectifying path when said low DC voltage bus is high enough, thereby placing only the series combination of said two capacitors onto the mains AC-voltage, with regards to the second rectifying path. This results in the power being drawn by said second rectifying path when said regulating transistor is closed being mainly reactive. When said regulating transistor is opened, real power drawn by said second rectifying path increases, as the diode or diodes of the path conduct current, and the low DC-voltage bus capacitance is filled. Said controlling microchip may be used to switch the regulating transistor on and off according to the detected state of said low DC-voltage bus. To protect the regulating transistor in its open state from excessive mains related voltages if said second rectifying path utilizes a half-wave diode bridge, a diode may be placed across the low AC-voltage bus, that is across the voltage present after said high impedances, and before said half-wave bridge. This diode across said low AC-voltage bus short-circuits the bus during, for example, the negative mains half cycle, thus protecting the regulating transistor.

In the above embodiment, the two series capacitors of the cap-dropper supply are used to DC-decouple the second rectifying path from the mains AC-voltage. This DC-blocking ability of said capacitors allows the grounds of said first and second rectifying paths to be connected. The present invention teaches that such capacitor based decoupling need not be constrained to cap-dropper supply embodiments, but may also be used in embodiments where grounds of two rectifying paths need to be connected, without any cap-dropper supplies being used.

During the initial power-up sequence of the product, the microchip and associated circuitry may be powered via the alternative, high impedance energy path using very little power for example micro Watts. Once the microchip is powered sufficiently, and has completed its initialization routines, it may turn the SMPS on, which may result in the consumption of energy by the product that contains the SMPS, and an active state of both the product and the SMPS. To be clear, said microchip and said capacitive sensing circuitry may be supplied with electrical power via either said first or second rectifying paths, or via both, with said second rectifying path providing power via a high impedance/s, said impedance/s being used to lower the voltage applied to said microchip and capacitive sensing circuitry.

If the product wants or needs to enter an inactive state, it may indicate this to the microchip that controls the SMPS, or this selection of the low power mode may be a function of the capacitive sensing controller i.e. the microchip, that is, user touch or proximity gestures discerned from measurements of said electrode or sense plate structure capacitance may be used to place said SMPS into an inactive state. Accordingly, the SMPS may be entered into a low power state, either immediately, or once the controlling microchip has ascertained that the product is not in an active state anymore, or after another criterion has been met. Typically, an inactive state of the product is characterized by load current which is below a certain threshold for a certain period, that is, the load is less than a predetermined minimum for said period. The capacitive sensing enabled SMPS controller may also monitor the load current independently, without any input from the product or capacitive sensing circuitry, and place the SMPS into a low power inactive mode if the load is less than a predetermined minimum for a long enough period. During the inactive state of the product, and the SMPS it contains, the only energy consumed is that used by the controlling microchip, via said low power, power supply structure, which will typically be a very small amount.

During the inactive state of the product, and the SMPS it contains, the controlling microchip may use its inherent capacitive sensing ability to continually test for a previously specified change in capacitance of an electrode or sense plate structure, for example due to the increasing proximity of an approaching hand, or another device. Once such a change in capacitance occurs, the controlling microchip may switch the SMPS to an active state, to ensure that the product may re-enter an active state, if required, according to the present invention. Because SMPS is completely turned off during the inactive state, with no high frequency switching of power transistors occurring, a large source of noise is also removed. Therefore, according to the present invention, capacitive sensing may be performed with higher resolution or sensitivity than would be possible if a SMPS and capacitive sensing circuit are used which operate independently of each other, and where the SMPS is always on. According to another teaching of the present invention, the capacitive sensing circuitry is synchronized in some manner with the main switching frequency of the SMPS, in order to optimize capacitance measurement in terms of a Signal to Noise Ratio. For example, said microchip may perform capacitive sensing during periods when electrical noise due to said switching is at a minimum level, that is, it may take state changes of an switching element or elements into consideration. Or it may intelligently apply filtering techniques to enhance the signal to noise ratio of the capacitive sensing process.

If the SMPS is active, and switching, noise due to the switching may impede the sensing performance, especially when really low levels of change in capacitance, such as required for proximity measurements, are monitored. Thus having the SMPS entered into a low-power, non-switching mode of operation may have the added benefit of improving the resolution or sensitivity with which the controller may sense for a qualifying change in the environment of the SMPS, specifically when proximity of a user needs to be sensed.

In another instance of the present invention, the transition of the SMPS from its inactive to active states may be accurately controlled by said microchip to meet specific criteria, such as, but not limited to, soft starting, electromagnetic emissions and losses.

iii.b) Lamp Embodiment:

The present invention further teaches that the SMPS may be directly controlled by the user via the capacitive sensing user interface. For example, if the product is a lighting fixture with a light generating load, the user may directly control the amount of power delivered by the SMPS to said load via proximity gestures or touch gestures. That is, the amount of light emitted by said load is directly controlled by said switch mode power supply, and said switch mode power supply is controlled by said user, with said user control based on user effected changes in measured electrode or sense plate structure capacitance. This may help to reduce cost by effectively controlling the light via the SMPS energy transfer function. In a specific embodiment, a lamp may for example be a desk lamp, with the whole body of the lamp connected to a self-capacitance measurement circuit, which is used to detect user proximity in an ultra-low power mode. During this mode, capacitive sensing may be done with very high resolution, as the SMPS of the lamp is off, removing a large noise source. However since the SMPS functionality is integrated together with the capacitive sensing, the high voltage (e.g. 10V) typically required for fast startup of the SMPS functions may be kept available via the same high impedance path used to power the capacitive controller when the SMPS is inactive. Once user proximity has been detected at a sufficient level, and for sufficient duration, a Find-In-The-Dark (FITD) indicator, such as, but not limited to, an LED, may be turned on, to assist the user with the location of the controlling touch interface for the lamp. The complete lamp body or housing may be used as an electrode or sense plate structure for proximity detection. In an exemplary embodiment, the FITD device illuminates through a transparent, non-conductive material that is placed over the capacitive sensing electrodes used for the touch interface. During this mode, the SMPS may or may not be kept in an inactive state. If the SMPS is kept in an inactive state, the power for the FITD device may be supplied from the mains utility network via an alternative low power, power supply structure, as disclosed earlier. Said controlling touch interface of said desk lamp may be implemented with self- or projected capacitance sensors and circuitry. A projected capacitance measurement implementation may result in a touch interface which are less dependent on changes in impedance to electrical earth or fluctuation of the IC ground reference.

In an embodiment of the present invention related to the above disclosed lamp, a lamp may facilitate multiple light generating loads, with varying functions realized by each load, for instance a reading light, ambient lighting, mood lighting or a lighting scheme based on the audible sound in a room, or on music played by the lamp itself. Control of said light generating loads may be via number of user interfaces, including a proximity sensing interface, a touch interface, or others. The proximity interface may use dedicated capacitive sensing electrodes, or may use parts of or the complete body of said lamp to sense user proximity. A user may use said lamp to provide a light source focused enough to read by, and simultaneously, through another light generating load in the lamp, provide ambient or mood lighting, with both light generating loads under proximity or touch control, and with the realization of multiple colors possible. Or one light generating load of the lamp may be used to provide dim, colored lighting that changes according to music played by the lamp, or in the vicinity thereof, and detected, to help a user go to sleep, for instance, or to set a romantic mood. However, a simple proximity gesture over the lamp may then be used, according to the present invention, to activate a second, focused white light generating load, without disabling the ambient color light generating load. That is, the SMPS of said lamp is in an active state when said proximity detection used to recognize said proximity gesture, is made, since the first light generating load is powered before said gesture. Further, separate control of each light source as taught in the preceding disclosure may require a switching element in series with each light source, said switching element opened and closed according to a Pulse Width Modulation (PWM) signal. The lamp may also contain timer and adjustable alarm functions. For example, this may be used to wake a user by slowly increasing the intensity of one light generating load, and to give the user an indication of the time elapsed past a specific time point through variation of the ambient light color, e.g., blue means you have overslept a little bit, but if you wake up to red, you have grossly overslept.

iii.c) Load Cable as Capacitive Sensing Element:

The presently disclosed invention further teaches that the load cable which nominally connect a load to the SMPS output may be used as capacitive sensing electrode/s to help determine when said SMPS should be switched from inactive to active state. When said load cable is not connected to a load, e.g. a cell phone, no current will flow to the load, and the SMPS will be placed in a low-power, non-switching state to minimize losses, according to the present invention. If said load cable is connected in some manner to SMPS controlling capacitive sensing circuitry, the capacitance of the load cable, and of any load that may be connected to it, may be monitored for any changes. Therefore, when a user connects for example a cell phone to the cable, or grips the cable before connecting his/her cell phone, the capacitance of the cable will change, which will be detected by said capacitive sensing circuitry. This information may be used to assist with the decision of whether the SMPS should be returned to its active, switching state, or not.

The above embodiment may provide a solution to the scenario where a SMPS is separated by a fair distance from the load it powers, and where the user only physically interfaces with the load and the end of the charging wire or the charging socket that is inserted into the load (e.g. cell phone). In such a case, it may be difficult to sense for a qualifying change in capacitance if the capacitive sensing electrodes are situated at the SMPS, and not at the load. Using the example of a cell phone and charger again. If capacitive sensing electrodes are placed on the body of the charger, but a long cable, for example 1.5 m, connects the cell phone to the charger, it may not be possible to sense the user touching the load end of the cable, and plugging his/her cell phone in. If the SMPS of the charger has been placed into a low-power, non-switching inactive mode, according to the teachings of the present invention, the controlling microchip will not detect the user's presence, or actions via it's capacitive sensing circuitry, and the SMPS will stay in the low power mode. This may require the user to first access the charger, and for example touch it, before charging will commence, which may be frustrating, especially if the charger is plugged into a wall outlet which is difficult to reach or access. By connecting the load cable as an electrode to the capacitive sensing circuitry of the SMPS controller, user interaction with the end of a said load cable may be sensed, and used to return the SMPS to a fully active switching state.

According to the present invention, the above embodiment may use either projected or self-capacitance measurements to monitor for qualifying changes in the capacitance of the load cable. For example, if the load cable consists of two wires, feeding a Direct Current (DC) load such as a cell phone battery charger circuit, a projected capacitance measurement may be effected by connecting the transmitting (Tx) line of the capacitive measuring circuit to one wire, and the receiving (Rx) line of said measuring circuit to the other wire in the load cable. Typically, no load current or voltage will be present on the load cable during capacitive measurement process as the SMPS is in a non-switching, inactive state, removing the need to utilize protection circuitry to ensure the load voltage and current do not damage or negatively influence the capacitive measuring circuitry. However, use of such protection circuitry is not excluded from the teachings of the present invention. The load cable may also be electrically disconnected from the SMPS or from the circuit ground during the capacitive sensing process.

To utilize self-capacitance measurements to monitor for qualifying changes in the capacitance of the load cable, a single capacitive measurement channel may be connected to any of the wires of the load cable, or multiple capacitive measurement channels may be used to connect to each wire in the cable. It is also possible to add additional wires or shielded wires to form special sensing electrodes.

The present invention further teaches that the above disclosed method of sensing the capacitance of the load cable may be combined with measurements of the load current to assist with the decision whether or not to return the SMPS to a fully active switching state. If the controller of the SMPS senses a qualifying change in the capacitance of the load cable, it may turn the SMPS on for a short period, and monitor the load current drawn. If the load current is not above a predefined minimum level, the controller may determine that a legitimate load has not been connected, and return the SMPS to a low power, non-switching inactive state.

An embodiment is practically possible wherein the SMPS is switched to standby or completely off (off being defined as no switching of current through the primary side of the transformer) for an undetermined period of time when a no-load condition is detected. Activity on the load cable or charging connector to the load is capacitively sensed and if (user) activity is detected, the SMPS is used to check the load/no-load status to resume normal operation or stay in off or standby mode. Similarly capacitive sensing as taught in this invention may be used to determine a change in the load impedance to restart the SMPS operation from a shut down state.

iii.d) Visual User Interface for SMPS Operating State Indication:

Another teaching of the present invention concerns the facilitation of a Visual User Interface (VUI) by the SMPS controller, with said VUI providing an indication of the operating state of the SMPS, and of other parameters. For example, said VUI may consist of an LED or LED's, with multi-color abilities. Various operating states of the SMPS may be indicated by various colors, for example blue if the SMPS is in an in-active state, with only the capacitive sensing circuitry enabled, green if the SMPS is active, but load current is below a pre-defined threshold, and red if the SMPS is supplying power above a pre-defined threshold. Further, according to the present invention, the VUI may be pulsed in some or all of the operating states of the SMPS and it's controller, to reduce the additional power consumption introduced by the VUI. The pulse rate may also be varied, according to the operating state of the SMPS and it's controller. For example, in the capacitive sensing only state, the VUI may emit blue light pulses at a very low rate. Once the SMPS starts up, but with load current still below a certain threshold, the VUI may emit green light pulses at a higher rate. As the SMPS delivers more and more load current, the emitted light pulses may change to red, either gradually, or with a step/s. In the latter case, the VUI may also be used to give a heart-beat indication. As load current increases, or SMPS power output increases, the pulse rate of the VUI increases accordingly until it is constantly on above a pre-defined maximum load current or SMPS power output. In this manner, according to the present invention, the user is provided with a visual indication how hard a certain SMPS is working, for instance a cell phone charger, or the power supply of a welding machine. The VUI may also be fully controllable via the capacitive sensing interface of the SMPS controller, according to the present invention. For example, it may be possible to disable the VUI via specific touch gesture. Having a VUI as described may assist users to place SMPS and the products containing them into the lowest possible power consumption mode possible, when not being used. For instance, users often leave their cell phone chargers plugged in, for convenience sake, even when they are not charging a battery. With a VUI as described, the user will see that said charger has an active SMPS, and may place the charger into a capacitive sensing state only, as disclosed, via the capacitive sensing interface of the SMPS controller, thus ensuring minimal losses. Before walking away, the user may verify this state via said VUI.

In a related embodiment of the present invention, a VUI with more than one visual indicator element, e.g. two or more LED's, may be realized. A first visual indicator may be used in the above manner, to indicate the operating state of the SMPS and its controller. A second visual indicator may be used to indicate the estimated efficiency or losses of the SMPS for a given load current. This may assist the user to make intelligent decisions regarding the usage of the SMPS and the product that it powers.

Incorporating a capacitive sensing function into a SMPS controller, as taught by the present invention, may facilitate moving some functionality from the product directly to the SMPS, especially if the SMPS is contained within a separate housing. For example, it may be possible to select charging current for a battery directly on the SMPS casing, if separate from the product casing, according to the present invention. Or, one may possibly select a function via the capacitive sensing interface of the SMPS where a battery is first discharged before being charged via the SMPS, as is beneficial for certain battery types.

iii.e) Retrofit-Able Light Source Embodiments:

In another lighting embodiment of the present invention, an LED bulb, or another light source, contains a SMPS, said LED bulb, or other light source, being retrofit-able in the place of an incandescent or fluorescent bulb, said SMPS being able to accurately detect points in time where the applied mains sinusoidal voltage crosses zero volts, traditionally referred to as Zero-Cross (ZC) detection. According to the present invention, if said LED bulb, or other light source, is retrofitted or used in a light fitting which is controlled by solid state switch based dimmer circuitry, said ZC-detection ability of the SMPS may be used to implement additional functionality, based on the setting of said dimmer circuitry. In prior art dimmers, solid state switches are used to dim the amount of light emitted by only closing for a fraction of the mains 50 Hz/60 Hz positive or negative half cycle. That is, said solid state switches only apply the mains voltage to the lighting element for a fraction of the mains half cycle, with the result that the emitted light seems less to the user. Naturally, if said solid state switch is closed for the complete half cycle, the emitted light is at a maximum, and if it is never closed, the emitted light is zero. If the mains voltage ZC-point can be accurately determined in time by the SMPS of the present invention, this point may be used to measure the exact portion of the mains half-cycle during which the solid state switch of said dimming circuitry is closed, i.e. what the present dimming setting is. This information may then be used to activate another function, or select some pre-defined level, which influences the operation of said LED bulb, or other light source, and SMPS. For example, if said LED bulb, or other light source, has the ability to emit colored light, a specific dimmer setting may be used to emit a specific light color. Or, as another example, a specific dimmer setting may be used to select continuous color mixing of the light emitted by said LED bulb, or other light source. In another exemplary embodiment, a specific setting of said dimmer circuitry, which are external to said LED bulb, or other light source, may be used to select an specific auto-off timing sequence. For example, if said dimmer is set to close said solid state switch for only twenty percent of the mains half-cycle, this may be used to select an auto-off sequence, whereby the SMPS in said LED bulb, or other light source, will turn the light being emitted off after a preset time. Or the emitted light may fade gradually, helping to induce sleep. Or color may be slowly mixed, in conjunction with a slow decrease in light level, to help a user go to sleep. From the above it is clear that the LED bulb, or other light source, may contain a programmable memory element to store user selections, allowing quick access and activation at a later stage. Is should also be evident that a plethora of embodiments are possible within the spirit and scope of the invention.

In yet another related exemplary lighting embodiment of the present invention, a retrofit-able LED bulb, or another light source, may contain a SMPS with ZC-detection ability and have an exhaustible power source like a capacitor which may be used to power the controller of said SMPS for a finite period after mains power has been removed by opening a mains switch situated between said LED bulb, or other light source, and said mains power source. Said controller interprets the presence of a ZC-detection signal as indication that said mains switch is closed, and the absence of said ZC-detection signal as indication that said mains switch is open, i.e. the power has been switched off. Therefore, if said mains switch is first closed, then opened and then re-closed before said finite period, during which said controller is powered by said exhaustible power source, has expired, said controller may determine the period during which said mains switch was open. According to the present invention, said latter period may be used to qualify activation of additional functionality for said LED bulb, or said other light source. Such functionality may for example be a dimming function, instant or gradual, a color change or mixing function, an auto-off function or any of the large number of possible functionalities. Or the above described action cycle of closing, opening and re-closing said mains switch may be followed by a number of similar action cycles, with the number of repeated action cycles used to qualify additional functionality for said LED bulb, or said other light source. Or a first action cycle of closing, opening and reclosing said mains switch may start the execution of a function, for instance gradual dimming of the light, and a second action cycle of opening and reclosing said mains switch may halt execution of said function. That is, according to the present invention, for example, a user may dim a light fixture incorporating the present invention by closing the mains switch, which does not form part of the present invention, opening it, and reclosing it after a specific time, starting a gradual dimming process, which may then be halted at the desired point by again opening and reclosing said mains switch in a prescribed manner. Further, according to the present invention, said LED bulb, or another light source, may also incorporate non-volatile memory of some kind to store user selections, which have been programmed in some manner, including the possibility to use the above closing, opening and re-closing of said mains switch as programming medium. Once stored, the user may, for example, simply close the mains switch to activate a stored setting. Or if more than one setting has been stored, the user may select between these via differing sequences of closing, opening and reclosing said mains switch.

In yet another exemplary embodiment of the present invention, the above disclosed action cycle used to select specific power levels or functionality of said LED bulb may be facilitated through the use of a mains voltage rated Normally Closed (NC) push button type switch, where said push button switch is in series with a traditional electromechanical mains switch, typically a rocker/slider type but with the last mentioned switch possibly being a secondary switch and not used in daily operation. To turn said LED bulb on, a user would typically close said electromechanical switch and according to this embodiment further control of the light is done with the NC push button switch. Since said push button switch is NC, power will be supplied to said LED bulb even when the light is off. To perform a mains action cycle, as disclosed earlier, said user only needs to press said push button more than a minimum period, and release it before a maximum period passes. When said push button is pressed, it enters an open state, thus the LED bulb SMPS controller will detect a period where mains power is removed, and the controller is powered by said exhaustible supply, as discussed earlier. If said mains absence period is long enough, a legal action cycle event may be declared, and used to change LED bulb functionality. As before, said user may press and release said push button numerous times, to select between a number of possible functions for said LED bulb or another light source. The push button switch is used to transfer commands to the controller of the SMPS including "ON" and "OFF" commands. The advantage of the NC push button over a traditional wall switch is that only a single action is required from the user for some commands.

In a variation of the above embodiment, the NC push button switch is used on its own, without an electromechanical switch in series with it. However, the present invention teaches that in such an embodiment, provision may be made for means by which the user may lock the NC push button in the "open" or "break" state, for example via the use of a mechanical pin or clip, which said user may press to lock said switch in said "open" or "break" state. Such an embodiment may for example be used when said switch needs to remain open to allow safe maintenance on the mains circuit in which said switch is located, or for other safety reasons. The present invention further teaches that a traditional latching, toggle type mains switch and a push button type mains switch may be combined into a single unit. In such a combination, said switch may be used in either a latching mode, or a NC push-button mode, with either selected by the user through interfacing with a dedicated mechanical structure. For example, but not limited to, a user would make use of the NC push-button mode to interface with LED bulbs as disclosed in the preceding discourse, and of the latching mode to interface with prior-art, non-intelligent, fully-on-or-off light sources, or to latch said switch in an "open" or "break" state for safety reasons.

In yet another exemplary embodiment of the present invention, an LED bulb, or another pertinent light source, is realized where the SMPS part of said bulb (hereinafter referred to as the SMPS-base) may be separated by the user from the light emitting part (hereinafter referred to as the light-head), and where the SMPS is designed to, for example, provide a fixed current or a fixed voltage output, irrespective of the number of LED's, or other light emitting elements, connected in series, parallel or a combination thereof, to said output. This may allow said user to use light-heads with varying amounts of LED's, or other light emitting elements, with the same SMPS-base, if he/she so desires. It is envisaged, for example, that a user only purchases one SMPS-base, which contains said SMPS. He or she may then purchase a number of light-heads, with varying light output levels, or emitted colors, and fit said light-heads to said SMPS-base as is required. For instance, if a user requires an LED bulb, or other pertinent light source, with a higher light output, he or she only needs to replace the light-head of the LED bulb with a unit containing more LED elements, or with elements that emit more light. Or, when improved light emitting elements are released onto the market, a user does not need to purchase a complete new LED bulb, or other pertinent light source, but may only be required to purchase the new improved light-head, and fit this to his/her old SMPS-base, containing said SMPS, resulting in less monetary expenditure for said user. In yet another example, a user may wish to temporarily change the color emitted by an LED bulb, for instance for a social event, but do not wish to purchase a complete new bulb. He or she may then only replace the light-head, according to the present invention, with another similar light-head that emits the desired color.

The present invention further teaches the use of load current based control to facilitate LED bulbs, or other light sources, as disclosed above, where the SMPS-base may be separated from the light-head. A control signal which is proportional to the load current flowing though said LED's or lighting elements are fed back via a direct or isolated path to the controller of said SMPS, for control of switching on the primary side of the transformer of the SMPS. Said switching is controlled in such a manner that the load current remains constant, irrespective of the number of LED's or other lighting elements that are connected as load to the secondary side of said SMPS. This enables a user to increase the amount of light emitted by such an LED bulb, or another light source, by simply increasing the number of LED's or other lighting elements.

According to the present invention, the heat sink used for dissipation of heat generated by the LED elements, or other light emitting elements, contained by said light-head may be contained in said SMPS-base. If this is the case, it is imperative to have good thermal coupling between said light-head and said SMPS-base. This may be facilitated in a number of ways, as is known in the art of heat transfer for electronic devices, specifically for high power LED's. By including said heat sink in said SMPS-base, a large cost element is removed from said light-heads, as costly amounts of metal is normally used to realize such heat sinks. This may facilitate the cost-effectiveness of having LED bulbs, or other light sources, with separate SMPS-bases and light-heads. Said heat sink contained in said SMPS-base should have sufficient radiation ability to accommodate the highest power light-head that may possibly be fitted to said SMPS-base, as specified during the design of said SMPS-base. Naturally, this may lead to LED-bulbs, or other light sources, as disclosed, being grouped into certain ranges based on the heat radiation ability of the SMPS-base, as it is foreseeable that it may not be cost effective to use, for example, a SMPS-base with a heat sink designed to facilitate use of a 20 W light-head, for a 1 W light-head.

For LED bulbs, or other light sources, with separate SMPS-bases and light-heads, as disclosed and discussed above, the present invention further teaches that said heat-sink may be electrically isolated from the said lighting elements, for example LED's. This may allow the use of non-isolated, relative to the mains utility network, SMPS topologies to drive said lighting elements, which may be more cost effective. However, use of such topologies may introduce safety requirements to prevent users from accidentally coming into contact with mains voltages, or voltages referred to mains, via the main load terminals used to connect said SMPS-head to said light-head. The present invention teaches that said requirements may be met by only powering the output terminals of the SMPS-base when a light-head which has been properly inserted is detected. This may also be used to reduce the quiescent power consumption of the SMPS-base when no light-head is inserted. Said detection of a properly inserted light-head may be done in a number of ways, according to the present invention. For example, the SMPS may be turned on momentarily to test for a specific load current that will only flow through an isolation safety capacitor if said light-head has been inserted properly. The design of said light-heads must be such that it is impossible for a user to get said specific load current through said isolation safety capacitor to flow, even if they engage the one terminal of said isolation safety capacitor. In another exemplary embodiment, inherent capacitive sensing capabilities of the SMPS, as disclosed earlier by the present invention, may be used to detect the correct insertion of said light-head through an isolation barrier, completely protecting the user. That is, when no light-head has been inserted, the user may engage the SMPS output terminals, but these will not be powered. Said user may also engage an area which is used to capacitively sense when a light-head has been properly inserted, but an isolation barrier in said area prevents said user from touching mains voltages, or voltage referred thereto. The latter exemplary embodiment may have the advantage of significantly reduced quiescent current when no light-head is properly inserted, as the SMPS can be completely turned off, with only the capacitive sensing part of the SMPS controller circuitry enabled, as disclosed earlier.

The present invention further teaches that spring loaded mechanical means may be used to cover potentially dangerous terminals in a SMPS-base when a light-head is not inserted, akin to means used to improve safety of mains wall receptacles.

To ensure compatibility between various light-heads and SMPS-bases, the present invention teaches that a standard mechanical interface between light-head and SMPS-base may need to be defined. For example, two prong blade type connections may be used, where the female receptacles of the connection is contained in the SMPS-base, and the male prongs are contained in the light head. The standard may specify the dimensions of said receptacles and prongs, as well as the spring force used by the receptacles. This will ensure that different light-heads may be used on the same SMPS-base. A standard mechanical interface between light-head and SMPS may also be used to group LED bulbs, or other light sources, according to certain ranges, for instance power ratings. For example, said standard mechanical interface may be defined in such a manner that a light-head of the ten to twenty Watt group will not fit on a SMPS-base of the one to ten Watt group, etc.

If a mains isolated SMPS topology is used for said SMPS-base, the present invention teaches that the load current via the main load terminals may be monitored periodically to detect when said light-head has been inserted properly, without unacceptable risk to the user.

The present invention further teaches that a signal proportional to the temperature of the unit may be fed back to the controller of the SMPS that powers said LED bulb, or another light source. Such a temperature based feedback signal may be used to determine the amount of power delivered to the lighting load to prevent overheating, and may be used in conjunction with, or apart from, a load current feedback signal to control the functioning of said SMPS. Further, the present invention teaches that said temperature based feedback signal may be used as a safety parameter, where the output of said SMPS is turned off when more than a predetermined maximum amount of heat is dissipated by the LED's or other lighting elements. This may assist to reduce the likelihood that LED bulbs, or other light sources, constructed according to the teachings of the present invention, fail in such a manner as to become fire hazards.

Further, the present invention teaches the technique of communicating with an LED bulb, or another light source or load, via the normal mains cabling installed, thereby remotely activating, deactivating or controlling specific functionality for said LED bulb, or other light source or load, for example, but not limited to, a dimming function or a change in the color of light being emitted, said LED bulb or other light source or load having the ability to detect mains ZC-points, as well as the ability to demodulate messages communicated over the said mains cabling, with said messages and communication based on the omission of a specific number and sequence of mains cycles or half-cycles.

In one exemplary embodiment of the invention, a wall control unit, with a touch or proximity sensing user interface, replaces the normal wall mains switch that controls an LED bulb, or another light source or load. A user may enter specific commands through the execution of relevant touch or proximity gestures on or over said touch interface. Said wall control unit also comprises ZC-detection circuitry, as well as some kind of switching element, for example, but not limited to, silicon control rectifiers (SCR's), TRIAC's or field effect transistors (FET's). After interpreting said user gesture, said control unit will typically communicate the relevant command over the connected mains cabling by using said switching element to selectively omit a specific number and sequence of mains cycles or half-cycles from the mains waveform applied to said LED bulb, or other light source or load. Said omission may be performed by opening said switching element during a mains ZC-event, and re-closing it during a subsequent, or later, mains ZC-event. Said LED bulb, or other light source or load, have the ability to detect mains ZC-events, to demodulate communication based on mains cycle or half-cycle omissions, as described, and to perform the required task, be it to dim emitted light to a specific level, to change the color of emitted light or to start a delayed auto-off function, to name but a few. To help ensure that said LED bulb, or other light source or load, do not react erroneously to noise present on the mains cabling, all messages may contain cyclic redundancy checks (CRC's), as is well known in the art of digital communication systems. Because the communication method taught by the present invention only opens or closes said switching element of said wall control unit during ZC-events, it will typically not emit a large amount of noise into the mains network, reducing the need for additional filtering to meet international emission requirements, as may be pertinent. Said wall control unit may also employ Find-in-the-Dark (FITD) functionality, activated after a relevant proximity or touch event, to assist a user to locate said wall control unit in low light conditions, e.g. at night. The FITD effect may also be shown on the main light source by means of the same communications.

Bulbs (e.g. LED's) may for example be sold as "Immediate off", "30 seconds delayed off", "1 Minute delayed off with dimming" or any such variable in order to facilitate intelligent lighting at very low cost. "Delayed off with dimming" may be further characterized by the amount of dimming in conjunction with the delay period. For example, bulbs may be sold as "10% dimming with 10 minute delay", meaning the bulb with dim to 10% of its nominal light output and switch off after a 10 minute delay, should a user perform an action cycle of switching the connected mains switch on, then off and then on again, according to certain timing requirements. The term bulb and its plural does not only refer to LED based bulbs, but may be any type of light source contained within what is generally known as a light bulb.

The wall switch may have a normal electromechanical switch to be used for cutting power, and another touch sensor user interface used for normal on/off, dimming, color selection etc.

The present invention further teaches the possibility to use a single wall control unit, as disclosed above, to control a large number of mains powered loads. Each load, for example an LED bulb, may have a specific address, or a general address, and will only react to a command communicated on the mains cabling if it has first been addressed in a proper manner. The invention also teaches that a general command may be used to instruct all connected load elements simultaneously, without the need for specific addressing. For example, a user may wish to dim all LED light bulbs connected to a specific wall control unit to the same level. Further, according to the present invention, said wall control units may also include the ability to receive commands from smart utility meters, for example via a wireless interface. Such commands may, for example, instruct the wall control unit to dim all light emitting devices connected to it to seventy five percent of nominal brightness, in an effort to stabilize utility grid consumption.

In the above disclosed embodiments of the present invention, it may be advantageous to only omit half-cycles from the mains waveform applied to an LED bulb or another light source or load, as opposed to omitting full mains cycles, during communication according to the manner disclosed. When only half-cycles are omitted, some power is still delivered to the load, whereas if complete cycles are omitted, less cycles may be omitted before it becomes discernible to the user, or before the load has to draw energy from some kind of exhaustible energy store. Further, the switching element required for half-cycle omission may be less costly than that required to implement full cycle omission.

One example of a modulation scheme that may be used in an embodiment of the present invention as disclosed above, it to interpret all omitted negative half-cycles as digital zeroes, and an allowed full cycle as a digital one. This is purely presented as example, with a large number of modulation schemes possible within the spirit and scope of the present invention. The present invention also holds that specific preamble sequences may be used to identify valid messages to receiving load units. Further, because said wall control units and LED bulbs, or another light source or load, all have the ability to detect ZC events, and are therefore synchronized, communication may also be performed in a staggered fashion, to overcome the limitation on the maximum number of cycles or half-cycles that may be omitted before being discernible to the user. That is, said wall control unit may spread the digital content being communicated out over a fairly long period, with specific intervals between digital words, said interval lengths known to both transmitter (the wall control unit) and receivers (the LED bulbs, or other loads) and chosen to ensure that discernible dimming of the light, or other discernible degradation of said other loads, do not take place.

Further, the present invention teaches that a lighting load that is controlled by a SMPS, for example an LED bulb, as described previously, may have the ability to mix the color of light being emitted, with said mixing done autonomously, or according to a specific command received via a user interface, where said user interface may for example be a capacitive sensing interface, or a switch being sequentially opened and closed, as disclosed in preceding sections. Said mixing of color may be random, or according to a specific time based pattern. Lighting loads controlled by a SMPS according to the present invention may also be placed into a candle mode, where the amount of light being emitted by one or more lighting loads is varied continuously to emulate the seemingly random lighting patterns generated by burning candles. Use of such a candle mode is not limited to loads which emit white light only, but may be used with any color or colors of light. For example, the present invention teaches that LED bulbs may be realized, of any of the kinds previously herein described, where the user may place said LED bulb into a candle mode through a user interface command, where said user interface is a normal wall mounted mains switch, and said command is a specific action cycle of opening and closing of said mains switch, as disclosed earlier. It is envisaged that a user may, for example, use an LED bulb of the present invention to provide a specific level of light for a room during normal use, but may also use the same LED bulb to create a candle light effect by simply preforming a specific opening/closing action cycle at the wall mounted mains switch of said room.

iii.f) Capacitive Sensing Control Knob:

To overcome prior art limitations in terms of the control of a light dimming function, or another adjustment function, as listed in the background of this disclosure, the present invention teaches that a capacitive sensing based control knob may be used. Said capacitive sensing control knob may be based on projected, or mutual, capacitance measurements and static, opposing arrays of transmitter (Tx) and receiver (Rx) electrodes, with an electrically floating member, which may be conductive, moved over or between said Tx and Rx electrode arrays when the knob is turned. Said floating member is typically dimensioned to influence the capacitance measurement of only a single or small number of Tx and Rx electrode pairs. As such, the movement of said floating member may be tracked relative to the position of said static electrode array. A self-capacitance embodiment may also be realized, as will be evident to those skilled in the art of capacitive sensing. Said static electrode array may be used to detect touch or proximity actions of the user. To interface with said control knob, according to the present invention, the user may first touch the knob, which may turn on a light emitting element, if the load is a lighting element. If the user then moves said knob in a particular direction, this motion may be tracked due to the corresponding movement of said floating member, which may be conductive, and the amount of light emitted may be dimmed according to the amount of knob rotation. The amount of dimming realized does not have to be dependent on the time taken to rotate said knob, neither on an absolute starting point. Therefore it overcomes some of the limitations of the prior art, in terms of dimming control knobs or single touch sensor devices. The user may turn the light off with a second tap to the knob. Further, dimming may be done from a lamp off condition by touching and turning the knob in one motion or action. Due to the knob being both a rotational transducer, and a proximity and touch interface, a rich variety of interfacing gestures and actions may be possible. It is envisaged that the disclosed capacitive sensing based knob may be used for more than lighting dimmers, for example it may be used to control audio levels, color mixing and electrical motor speed control amongst others. The present invention also teaches that a control knob as disclosed may facilitate a Find-in-the-Dark (FITD) functionality, where the FITD indicator may be activated due to either a proximity or touch event detected by said knob's capacitive sensing circuitry.

iii.g) Mobile Device Charging and Digital Data Transfer:

To overcome the challenges of the prior art with respect to the charging of portable electronic products, the present invention holds that the capacitive sensing abilities of said controlling microchip may further be used to transfer data over plurality of dielectric barriers, in an isolated manner. This may be combined with inductive charging circuitry, or any other relevant technology, as held by the prior art, to realize universal charging stations that can accept a wide range of different portable electronic devices, and charge them without the requirement for galvanic connection, according to the present invention. Said data transfer may be based on the manipulation of capacitive sensing circuitry in only one of or in both the transmitting and receiving units. A large number of manipulation schemes may be possible.

An exemplary embodiment of the present invention that realizes such a universal charging dock or platform may typically function as follows. When no device is present in the charging dock or on the charging platform, the controlling microchip may sense it via its capacitive sensing interface, or via the inductive charging circuitry. As such, the SMPS of the charging dock may be placed in an inactive mode, which may minimize losses. In this state, the controlling microchip may be powered via a high impedance path, as described in the previous disclosure. The controlling microchip may use its inherent capacitive sensing ability to detect the approach of a user's hand, or of a device to be charged, or it's placement in the charging dock, or on the charging platform. This may result in the SMPS being returned to an active mode. The device to be charged may be oriented in such a manner that the sensors of its capacitive sensing circuitry is sufficiently juxtaposed with the sensors of capacitive sensing circuitry of the charging dock to allow data transfer. Alternatively, the present invention allows for a charging platform which may have its capacitive sensing circuitry electrodes arranged in such a manner that the device to be charged should always be close enough to a pair of electrodes to allow data transfer. Manipulation of the capacitive sensing circuitry may be used to transfer data between the device and the charging dock or platform. Such data transfer may be used, for example, to identify the device to be charged, to communicate the required current or voltage levels or what the age of the battery is. Once the charging process has been started, said capacitive sensing based communication interface may be used to relay instructions from the device being charged to the charging dock, for example the request for a lower charging rate, or an indication that the battery has been filled, or to terminate charging at a specific point in time.

Because the same capacitive sensing enabled microchip may be used to control the SMPS for minimum losses, and to facilitate capacitive sensing based data transfer, and if inductive charging is used, for example, an embodiment as disclosed above may largely overcome the challenges of the prior art with respect to cost-effective universal charging docks for portable electronic devices that allows easy, robust and safe charging.

According to the presently disclosed invention, manipulation methods as disclosed hereafter may be used to affect a capacitive sensing process sufficiently to allow data transfer in one or both directions between a stationary host and a mobile electronic device across a plurality of dielectric barriers.

When a mobile electronic device encounters a host, and its sensing electrodes are sufficiently aligned with that of the host, it may sense the charge transfers facilitated by the host. This may give the mobile device the ability to synchronize in time with processes occurring in the circuitry of the stationary host. The engaging electrodes of the mobile device may be connected to circuitry that may allow it to switch in a plurality of additional impedances between said electrodes, as needed. Therefore, to transfer a binary data string to the host, the mobile device may simply switch a specific impedance in or out between two sense pads when projected capacitive measurements are used. This should result in an abrupt change in the number of charge transfer counts measured by the host for example in the next charge transfer cycle. By monitoring the direction of the abrupt count changes, the host may detect the data from the mobile device. The above impedance change and detection scheme may thus allow data transfer from the mobile device to the stationary host.

Alternatively, the mobile device may switch a specific impedance in or out between its engaging electrodes to relay a previously defined message to the stationary host. The host may then demodulate by monitoring the relative change in measured charge transfer counts. Such a modulation scheme may need calibration of the system to allow accurate data transfer. Dynamic calibration may also be used, according to the present invention.

The amount of data that can be transferred with capacitive sensing manipulation schemes as presently disclosed is directly proportional to number of counts required to complete a charge transfer cycle. For example, If the capacitive sensing circuitry of the stationary host is setup such that 500 counts represents the threshold level, a number of charge transfer cycles with 500 transfers have to occur before an accurate signal may be discerned. To increase the data throughput, the counts threshold may be reduced. If the threshold of the above example is reduced to a 100 charge transfer counts, the data rate may increase five-fold. According to the present invention, initial thresholds will be at a typical value, but after a touch or proximity event, this may be reduced to increase data rate. The amount of data to be transferred according to the methods of the invention presently disclosed may thus be limited by the Signal to Noise Ratio (SNR) of the capacitive sensing circuitry and system performance and implementation. The number of counts required for a specific charge transfer cycle may only be reduced until SNR starts to affect reliability of the data transfer. This may play a direct role in the distance over which the data can be transferred. For example a mobile device that is in physical contact (through an dielectric layer) will have a much higher SNR than when it is only in proximity of the sensors, for example 5 cm away.

According to the present invention, the impedance used to couple the binary data onto the capacitive sensing process of the stationary host needs to be optimized for the specific charge transfer frequency, for example 500 kHz or 1 MHz.

The above disclosure describes an exemplary method to transfer data from a mobile device to a stationary host, according to the present invention. However, bi-directional communication, that is data transfer between stationary host and mobile device, and from mobile device to host, may also be possible according to the teachings of the present invention. By detecting and monitoring the charge transfer (CT) cycles of the stationary host, the mobile device may be synchronized to the host. To transfer data to the mobile device, the host may use Pulse Width Modulation (PWM), or other modulation schemes, to modulate data onto the end of a CT cycle, or another point along the time axis of the CT cycle. For example, the mobile device may test for a specific pulse width at the end of each CT cycle. Once this has been detected, the mobile device may know that a certain number of pulses that follow are data. The stationary host may then, for example, use a wider pulse width to denote a binary one, and a narrower width to denote a binary zero. The data transfer may continue until the host generates another pulse of specific width, for example. Or the modulation scheme may be designed that only one word of data is transferred at the end of a CT cycle, for example. Once the mobile device has detected the data from the stationary host, it may, or may not, respond by with data imposed onto the CT counts of the host, as described in the afore-mentioned disclosure.

Another exemplary embodiment of the present invention is the utilization of capacitive sensing in the control of a SMPS and robust, low cost secure data transfer in access control systems. Typically, these systems will have a hosting, stationary access card reader system, often wall mounted or on a pole close to the access point being controlled. The stationary card reader may typically be powered from a mains, or utility network, power source, and may utilize a SMPS. To avoid unnecessary losses of the SMPS during the typically long idle periods that such an access control system may experience, a SMPS controller with capacitive sensing ability, as disclosed by the present invention may be used. Therefore, the SMPS may be switched off during most of its operating life, with only the capacitive sensing circuit of the host card reader powered from mains via a high impedance path, with minimal losses. When said capacitive sensing circuit discerns a proximity event, for example due to an approaching users hand, or an access card, it may turn the SMPS back on. By the time that the access card is placed against, or close to the card reader, the SMPS may be fully functional. According to the present invention, the card may still be of a passive type, and dependent on inductive energy transfer from the card reader to operate. However, the inductive energy circuit of the hosting card reader may have the singular function of energy transfer, and not data, according to the present invention. Instead, capacitive CT based data transfer, as described in the afore-mentioned disclosure, may be used for cost effective, robust and secure data transfer between reader and card. Alternatively, and still within the teachings of the present invention, the card may be of an active type, or self-powered from an exhaustible supply, and use capacitive CT based data transfer to communicate with the card reader.

Yet another exemplary embodiment of the present invention may be found in two dimensional touchscreens used to transfer data to another device using the disclosed capacitive CT based data transfer method. For example, if a touchscreen employs projected capacitive sensing (e.g. IPhone, IPad or trackpad type device), it may be used to transfer data securely to the teachings of the presently disclosed invention. As before, if a SMPS is used on either end of the data transfer, it may be completely turned off to save power, and only energized when a valid proximity or touch event has occurred. Such an embodiment may found good application in highly secure data transfers, such as required for financial transactions, especially in applications such as web purchase payments and other high volume low cost transactions. The benefit is that any touch screen communications device may be enabled to perform financial transaction using a secure token mechanism communicating via the capacitive sensing screen or keyboard structure. Special mouse replacing track pads with integral inductive powering structures may also be implemented using the technology in accordance with this invention.

In a further embodiment the RF radiation from a phone transmitter structure may be used to power said card or token electronics, which may be used for a secure transaction. It may also be possible for the user to type a pin for the token using the touch screen or even writing the code on a track pad structure.

Alternatively, the present invention teaches that said token may, for example, be in the form of a stylus or pen, typically being gripped by a user. Said stylus may have a tip from conductive rubber, or another material. Due to the contact between the users fingers and the stylus or pen, a path with a capacitive impedance may exist from the casing of the stylus or pen to the local electrical earth. Therefore, according to the present invention, a switch may be used within said pen or stylus to connect the tip of the stylus or pen to its casing, which may be conductive, and thereby connecting said tip to said earth via the capacitive impedance of the users body. To transfer data from the stylus or pen to a host via a touch screen, or another interface, said switch may be closed or opened according to the binary level of the data, for example. When the switch is closed, charge will typically be transferred from the host touchscreen, or other interface, to earth. If CT capacitive sensing is employed by the host, for example, the closure of said switch in said stylus or pen should therefore result in an increase in counts for a projected capacitance sensing system, and a decrease in counts for a surface capacitance sensing system. Or alternatively stated, the closure of said switch in the stylus or pen like token, which is being gripped by a user, should typically result in the capacitance to earth of the users body being switched into the capacitive sensing circuit. As such, charge will be stored in said additional capacitance. For a CT based capacitive sensing based system, for example, this should result in an increase in counts for projected capacitance sensing and a decrease in counts for surface capacitance sensing. In this manner, a stylus or pen like token may transfer data securely to a host interface, which may be a touchscreen, and which may be based on either projected or surface capacitance sensing technology.

Due to the highly limited propagation of the electric fields used to transfer data between host and mobile device, as taught by the present invention, illegal interception of the data should be highly unlikely. Typical applications may include smart cards, electronic wallets, the use of cellular telephones or any digital communication device for financial transactions and purchases.

iii.h) Noise Immunity of Capacitive Sensing Circuits:

To overcome challenges in terms of conducted noise, specifically common mode noise, present in capacitive sensing applications of the prior art, the present invention teaches the use of a number of discrete charge transfer frequencies, with a minimum of at least two, testing for touch or proximity at each frequency, and using a sequential AND algorithm to annunciate a final touch or proximity event. That is, before a controller which embodies the present invention will declare a touch or proximity event, it will sequentially test for said event at a number of discrete charge transfer frequencies, with a minimum of two frequencies. Only if the touch or proximity event is detected at, for example, the first AND the second AND the third frequency, will the controller annunciate said event. Further, the present invention teaches that such sequential testing for a specific event may be conducted multiple times before declaring an event, to further improve noise immunity through a debouncing technique. The technique as disclosed improves noise immunity, avoid the false annunciation of touch or proximity events, and allow users to execute touch or proximity gestures even in the presence of noise, for example narrow band conducted noise. However, if the noise band is sufficiently wide enough to cover all the discrete frequencies used, false touch and proximity event declarations may still occur. This is of course also true for the spread spectrum approach.

To prevent false touch and proximity event annunciations caused by such wide band noise, the present invention further teaches the alternative of using a dedicated noise pick-up electrode, nominally inaccessible to the user, to identify the presence of noise, and block any output logic state changes, if the noise level is above a specific threshold at the frequency used for the noise pick-up electrode. To ensure that user gestures or actions are not detected by said noise pick-up electrode, and falsely seen as noise, said electrode must be shielded from interaction with the user, for example shielded with ground, or well within the product housing, beyond the capacitive reach of the user. However, the pick-up electrode must still be sufficiently sensitive to common mode conducted noise i.e. must have sufficient coupling to ground and/or earth. Further, the present invention teaches that the capacitive sensing channel connected to said pick-up electrode should typically have higher sensitivity than any other channels used to detect user gestures or actions. Such an arrangement may allow the detection of noise before it adversely affects said other channels, and block output logic state changes if the noise is above a specific level. Said blocking would avoid the false detection and annunciation of touch and proximity events, but would also inhibit the user of utilizing the capacitive sensing interface.

Given the stated inherent limits of the two techniques disclosed above, that is a multi-frequency technique with a sequential AND algorithm and a blocking technique, it stands to reason, and it is taught by the present invention, that a combination of the two techniques may be advantageous. To increase immunity to narrowband common mode conducted noise, a multi-frequency and sequential AND algorithm technique is used, without activation of the blocking function. That is, even though noise on the noise pick-up electrode may be of sufficient amplitude to trigger a blocking event, it is not allowed, as the noise is narrow band, and will only trigger one of the frequencies required to satisfy the sequential AND algorithm. Therefore, a user may still be able to interface with a touch or proximity gesture if the noise is of a narrow band nature. However, if the noise band is wide enough that it covers all the discrete charge transfer frequencies used, the multi-frequency based sequential AND algorithm may be satisfied, and dependent on some criteria, clarified below, the blocking event may be allowed, preventing the false annunciation of touch or proximity events.

When the pick-up electrode is exposed to narrow band noise of sufficient amplitude to trigger a blocking event, and a user makes a touch, it may seem like a wideband noise event as described above. The present invention teaches that these two events may be differentiated as follows. When a noise source of a specific frequency triggers the blocking channel, it will typically also result in a noise being detected at the corresponding frequency (one of the frequencies on the user interface sensor is the same as the charge transfer frequency of the noise pick-up electrode) for the capacitance sensing electrode which serves as user interface. Therefore, under narrow band noise, a minimum period may exist where both the blocking channel is triggered, and a noise induced (false) touch exist on said electrode at only the one corresponding frequency. This may be used to identify a valid touch when the other two frequencies also registers a touch, which will facilitate class A pass in terms of approval to the IEC 61000-4-6 standard (Class A=operation unaffected i.e. still detect a touch in noisy environment). If a wide band noise event occurs, the blocking channel will cross its qualifying threshold simultaneously or shortly before or after the user interfacing touch electrode crosses it's event thresholds at all the discrete frequencies, that is, said minimum period will not be present. By testing for said minimum period where the blocking channel is triggered in conjunction with only one frequency on the user interfacing electrode, before any potential touch or proximity event, a controller that embodies the present invention may discern between wide band noise events as described, and user touches during narrow band noise.

It should be clear that the above disclosed multi-frequency technique held by the present invention may use a single electrode, or any number of electrodes to test for a touch or proximity event at said discrete frequencies. If a single electrode is used, the different charge transfer frequencies will be evaluated sequentially, with application of the disclosed sequential AND algorithm. However, more than one electrode may also be used, with evaluation of the various discrete frequencies done simultaneously, or spread out through time in any manner, up to a purely sequential evaluation pattern. Naturally, the qualification algorithm will still be an AND function, but the manner in which the output is produced may differ.

Also pertinent to the multi-frequency technique disclosed is the use of filtering to avoid detrimental operation due to noise harmonics that coincide with harmonics of the discrete charge transfer frequencies used. I.e. when various harmonics coincide with harmonics of the multiple frequencies used in the charge transfer measurement. The present invention teaches that common mode impedance protection needs to be used where relevant to filter out these higher harmonics.

The present invention also teaches that one may use the disclosed capacitive sensing ability of a SMPS controller to monitor common mode currents flowing via a dedicated capacitive sensing electrode to electrical earth for frequency content and level, and use this information to adaptively control the switching of said SMPS in an effort to reduce emitted common mode noise. For example, if a frequency related to the switching frequency of the SMPS is detected in said dedicated capacitive sensing electrode with a level above a predetermined threshold, the SMPS controller may change switching frequency in small increments, within certain limits set by the passive components employed by the power stages of the SMPS. Each incremental change may be followed by a check if the level of said detected frequency at the dedicated capacitive sensing electrode has decreased to an acceptable level, followed by further adaptive changes as required. The SMPS may also control load level adaptively based on the common mode noise currents measured at said dedicated capacitive sensing electrode.

iii.i) SMPS Audible Noise Reduction and Power Factor Correction:

To overcome prior art limitations in terms of audible noise emissions by a SMPS, the present invention teaches that a variable pattern of skipped switching cycles may be used. That is, in some prior art lighting SMPS applications, dimming of emitted light at the secondary side of a transformer is effected by repetitively skipping a switching cycle, or a number of the switching cycles, on the primary side of said transformer. This results in less energy being transferred, and therefore less light emitted. However as the repetition frequency at which cycles are skipped is fixed, it may create audible noise if the repetition frequency is low enough. The present invention teaches that the audible noise emitted in the above manner may be decreased to a sufficiently low level not to be discernible by varying the repetition frequency at which pulses are skipped, i.e. a spread spectrum approach. Further, the pattern followed to determine the next pulse skipping frequency does not have to be fixed, but may vary, either in a constant manner, a quasi-random manner, or fully random. Such a technique as described may also be used to decrease higher frequency conducted or radiated emissions, as is relevant to EMC. Further, use of a variable pattern of skipped switching cycles, as described, may result in other benefits, such as a relaxation on the tolerances or sizes for high voltage passive components.

The present invention teaches that the power factor of a SMPS may be improved by Pulse Width Modulation (PWM) of a blanking period, said blanking period being imposed on the normal SMPS switching pulses, and where said PWM is dependent on the point within a given mains 50/60 Hz half cycle. When said blanking period is present, switching of the power switches, e.g. MOSFET's, of the SMPS is aborted. Starting at the ZC point, the blanking period is at a maximum value. As the mains voltage rises sinusoidally or according to another preferred algorithm to its maximum value at the mains quarter cycle point, the period of said blanking period, which itself is applied periodically, decreases accordingly to a minimum value. That is, at the mains quarter wave point, (highest mains voltage), the periodically applied blanking period has a minimum value (highest effective power switch duty cycle). From the quarter to half mains cycle points, the blanking period increases again to a maximum value at the second ZC point. This PWM scheme is repeated for each subsequent mains half cycle, be it positive or negative. Such a scheme improves the power factor drawn by the SMPS due to the fact that it effectively reduces the amount of power drawn when the mains voltage is at a low value, and increases the amount of power drawn when the mains voltage nears its maximum. This avoids large currents when the mains voltage is at a low value, thereby improving the power factor drawn by the SMPS. Stated in other words, the above scheme improves the power factor because it ensures that the SMPS transfers the most power when the mains voltage is close to or at its maximum.

If the frequency at which said blanking pulses repeat is in the audible band, for example if ten blanking pulses are present in each mains half-cycle (that is repetition occurs at 500 Hz), resultant audible emissions may become a nuisance to users. The present invention teaches that such audible emissions may be avoided by increasing the blanking repetition frequency while maintaining the ratio between the period that the main switching element of the SMPS is turned on and the period that it is turned off, taken over the previous blanking repetition period, which will result in the same amount of power transferred. That is, audible emissions may be avoided by applying blanking of said SMPS switching pulses at a higher rate, but with shorter blanking periods, to ensure that the same amount of power than before is transferred. In essence the SMPS switching is spread as evenly as possible over time.

According to the presently disclosed invention, a count of state changes of the main power switch element or elements of a SMPS within a limited period may be used to monitor the load placed on the SMPS, and to obtain information with regards to occurrence of possible short-circuit (SC) or no-load (NL) events. Such load status information may be used in conjunction with capacitance measurements to determine a condition for SMPS activation or deactivation, and to abort or adjust switching of said main power switch element during a SMPS active state, to respectively avoid excessive currents into a SC, or an excessive voltage over a NL.

The above disclosed embodiments are purely exemplary in nature, as an aid in the complete disclosure of the present invention, and shall not be construed as limiting in any manner.

BRIEF DESCRIPTION OF THE DRAWINGS

The invention is further described by way of examples with reference to the accompanying drawings in which:

FIG. 21 shows use of a Visual User Interface for a SMPS according to the present invention.

FIG. 22 shows integration of a dimming function into an LED globe with a SMPS, based on manipulation of the mains switch and ZC detection, according to the present invention.

DESCRIPTION OF PREFERRED EMBODIMENTS

Figure 1:
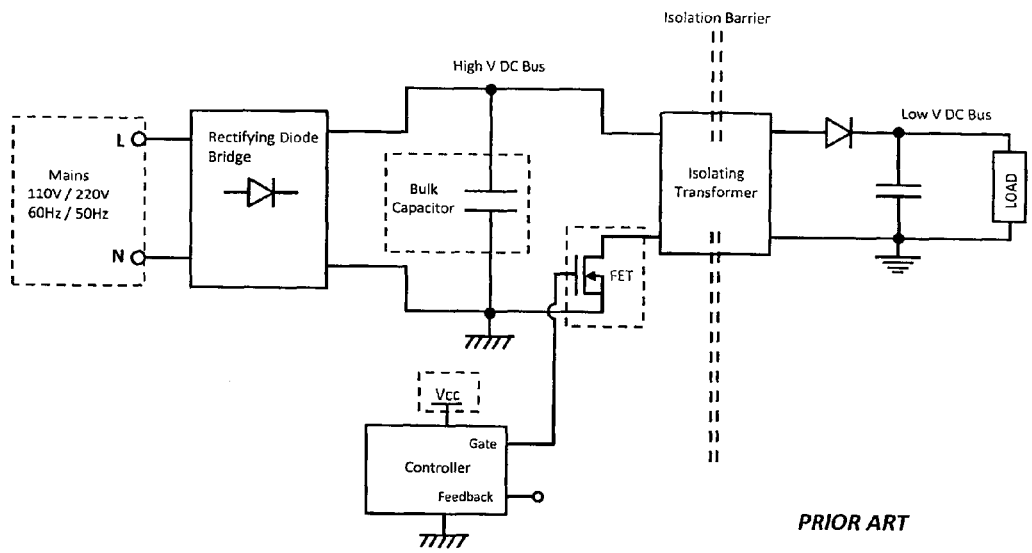
FIG. 1 shows a typical prior art SMPS, in this case an isolated fly-back converter.
Figure 2:
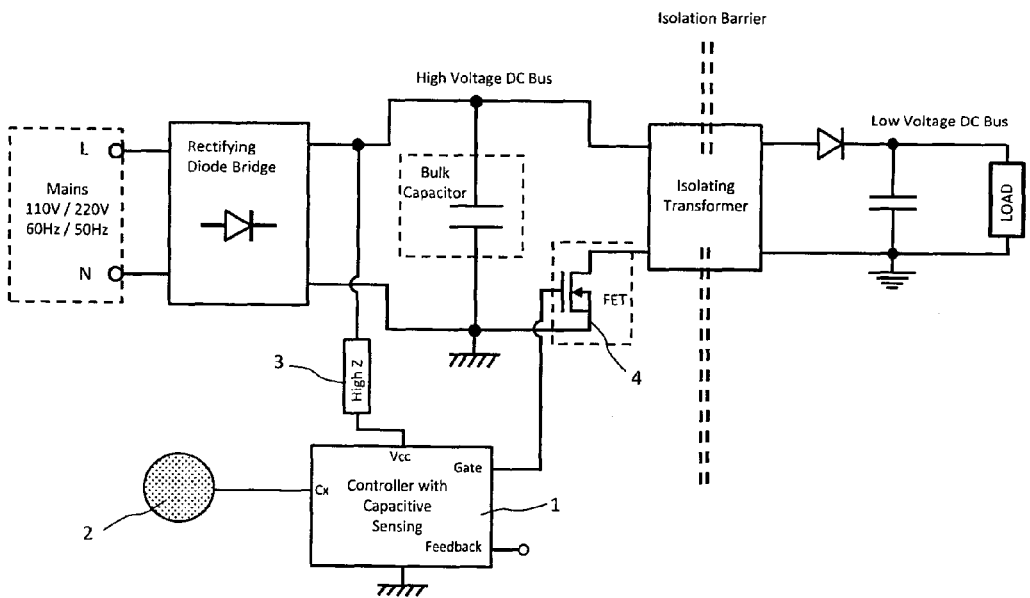
FIG. 2 shows an exemplary embodiment of the present invention, with the inclusion of capacitive sensing ability for the SMPS controller, and an alternative supply path dedicated to the controller.

FIG. 2 shows an exemplary SMPS that applies some of the teachings of the present invention. The alternating current (AC) supply from the mains, or utility network, is typically rectified by a diode bridge, resulting in a high level direct current (DC) voltage. This voltage may typically be maintained by a fairly large bulk capacitor, used as temporary energy store. For a fly-back converter, as illustrated, a main switching element, MOSFET (4) in the example shown, may be closed, which may allow current to build up through the primary winding of an isolation transformer, fed from the bulk capacitor. When said main switching element (4) is opened, the magnetic energy stored in the primary winding of the transformer will typically be commutated to the secondary winding, hence the name fly-back. The voltage at the secondary may depend on the turns ratio of the transformer. After rectification and storage in a secondary bulk capacitor, the output voltage may be fed to the load. In prior art converters, some feedback as to the state of the load may be given to the controlling microchip (1). If the energy being transferred to the load is below a specified value, controlling microchip (1) may increase the amount of energy stored and transferred from the primary winding of the transformer by an increase in the amount of time that main switching element (4) is closed. When no energy is consumed by the load, some energy will still be lost in the SMPS. This may be due to a minimum realizable switching duty cycle for the specific SMPS, or due to parasitic paths. According to the present invention, these losses may be avoided to a large extent by turning the SMPS completely off when load conditions merit it. Controlling microchip (1) may be supplied via a high impedance path (3) directly from the high voltage DC bus, as shown. It is imperative that said high impedance path, even if dissipative in nature, have significantly less losses than that of the SMPS when it is in an idle state. According to the present invention, controlling microchip (1) may have capacitive sensing, or other, sensing abilities. This may be used, in conjunction with a capacitive electrode or sense plate structure (2), or another sensor, to monitor for a predetermined change in measured capacitance, or another parameter. Once said change has been detected, the SMPS may be turned on again, with power available to the load within an acceptably brief period. Alternatively, according to the present invention, the startup of the SMPS may be delayed and controlled according to some criteria, such a soft starting or Electromagnetic Compatibility requirements. The fly-back converter in FIG. 2 is given purely as an example, and is should be understood that the disclosed methods and principles may be applied to any of the extensive number of SMPS topologies held by the Prior Art, for example, but not limited to, boost converters, SEPIC converters, full-bridge converters etc.

Figure 3:
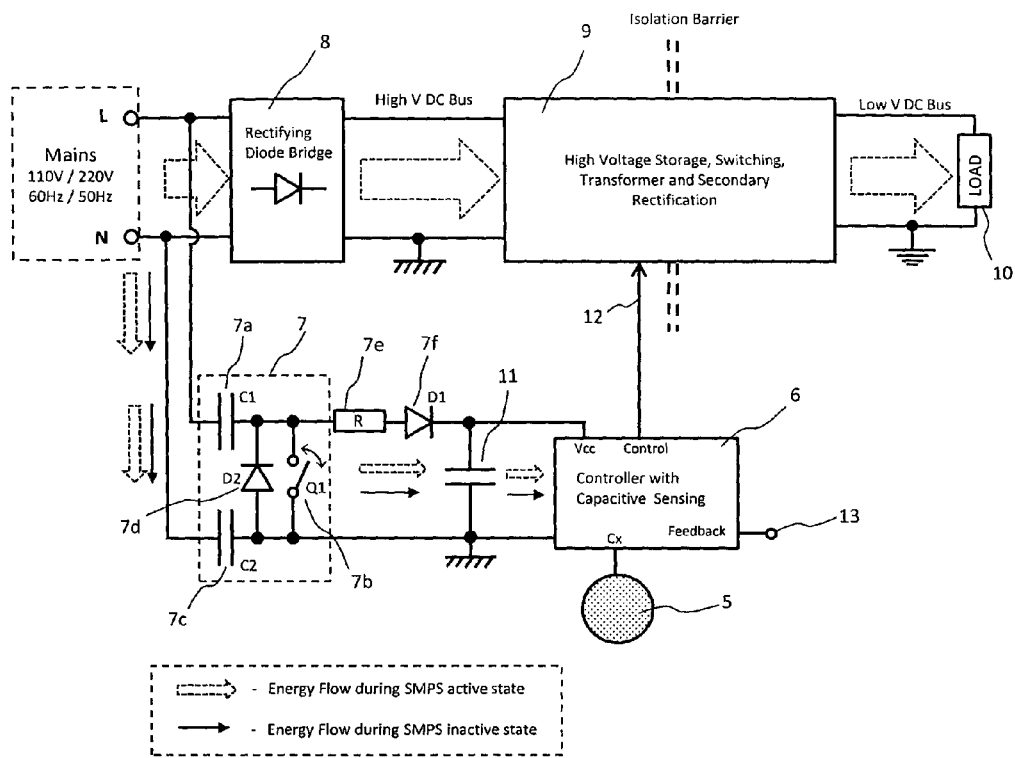
FIG. 3 shows an exemplary embodiment of the present invention, with the controlling microchip powered via capacitive dropper supply, and with indication of the energy flow during different states.

FIG. 3 illustrate energy flow during the various states of an exemplary SMPS that embodies the teachings of the present invention in more detail. As for the previous example, a mains AC source may be rectified by a diode bridge (8) in a first rectifying path, delivering a high voltage DC bus which may be processed by a storage and switching stage (9) to deliver energy in the correct format to a load (10). Stage (9) may be controlled by a microchip (6) according to feedback on the state of the output at the load (10) given at (13), with the control signal or signals applied at (12). Further, controlling microchip (6) may have capacitive sensing, or other, abilities, and utilize electrode (5), or another sensor(s), to measure a change in capacitance, or in another parameter. In the exemplary embodiment illustrated, controlling microchip (6) is powered via a low power, power supply structure comprised of a dedicated second rectifying path formed by D1, at (7f) and a so called cap-dropper supply, with most of the high mains voltage sufficiently dropped over the impedance of suitable capacitors C1 and C2, as shown at (7a) and (7c) respectively. Capacitors C1 and C2 are used to DC-decouple said second rectifying path from the mains AC voltage, allowing the grounds of first and second rectifying paths to be connected, as illustrated. A resistor (7e) may be inserted in series with C1 to improve immunity to fast high current surges. Although the embodiment shown by FIG. 3 uses half-wave rectification in the supply of microchip (6), this is purely as example, and a full-wave rectifying bridge may also be used in said second rectifying path. Compared to the embodiment of FIG. 2, the cap-dropper supply presented by FIG. 3 further reduces power consumption of the SMPS during it's inactive state, since the high mains voltage is dropped over reactive components, instead of being dropped over a power dissipating resistor. In other words, by using a capacitive dropper to supply microchip (6), more reactive power is drawn from the mains supply, but far less real power is dissipated in the process of lowering the voltage to be applied to said microchip (6).

In the embodiment of FIG. 3, a switching element Q1 at (7b), which may be, for example, a transistor, is used to regulate the low DC-voltage bus that supplies microchip (6), with bus capacitance (11). If Q1 at (7b) is closed, diode D2 at (7d) is short-circuited, and the mains AC-voltage is applied in its entirety to a series combination of C1 at (7a) and C2 at (7c). This results in the path that leads from mains Live and Neutral terminals to microchip (6) mainly drawing reactive power, with real power drawn being typically limited to the losses of C1, C2, Q1 and interconnect losses. During the period that Q1 is closed, microchip (6) consumes power stored in the bus capacitance (11) via said low DC-voltage bus. Once microchip (6) detects that the voltage on said bus is below a predetermined threshold, it may open Q1. This should result in current flowing via D1 during the positive mains half cycle to charge bus capacitance (11), and a corresponding increase in real power drawn. To protect the switching element Q1 at (7b) from excessive mains related voltages during the negative mains half-cycle, in the exemplary embodiment shown, a diode D2 may be connected as shown at (7d). D2 ensures that the negative mains half-cycle voltage is applied to the series combination of C2, D2 and C1, thus protecting Q1. To increase the power transfer during the open periods of Q1, a full-wave diode bridge may be used in said second rectifying path, in the place of D1 at (7f). In this case, diode D2 shown at (7d) may need to be removed, as its presence will negate the action of said full-wave bridge. Further, with a full-wave bridge, switching element may be placed after said bridge, to ensure that uni-directional current flows through said element when closed, which may be advantageous in terms of element cost and selection. However, in the latter embodiment, an additional diode may be required before the low DC-voltage bus capacitance (11), to ensure it is not discharged by said switching element. According to the present invention, when microchip (6) is powered via said low power, power supply structure with the rest of said SMPS in an inactive state, it may operate circuitry to measure said changes in capacitance of electrode or sense plate structure (5).

A Zener diode may also be used to regulate the voltage being supplied to controlling microchip (6). As shown, if the SMPS is turned off, the only energy flow will typically be from the mains supply towards controlling microchip (6). Once a valid change in capacitance, or another parameter, has been detected, and the SMPS has been turned on, the energy flow will typically be substantially from the mains supply towards the load. The amount of energy being consumed by the circuitry of controlling microchip (6) should typically be a very small fraction of that dissipated by the SMPS as it transfers energy to the load. However, the amount of energy consumed by the circuitry of microchip (6) should typically increase as shown in exemplary manner when the SMPS is in an active state. This may be due to the energy dissipated in the generation and transmission of driving/controlling signals, and due to indication LED's etc.

Figure 4:
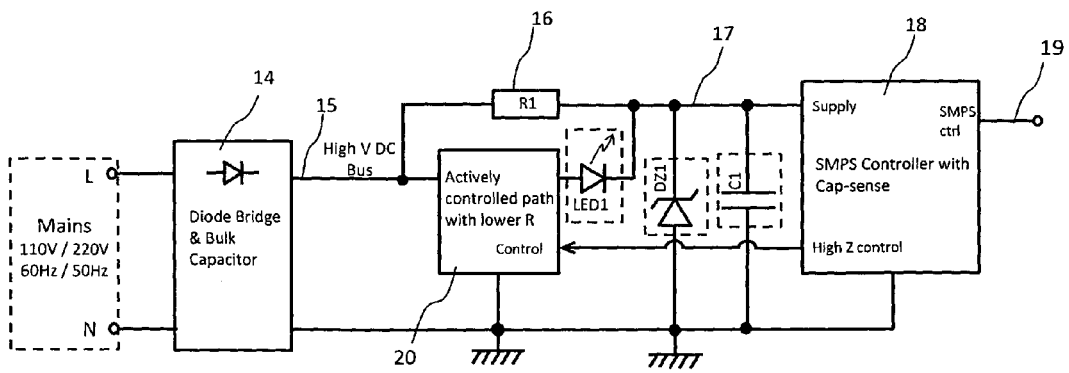
FIG. 4 shows an exemplary embodiment of the present invention that utilizes an actively controlled path to power a proximity indicating LED, and the controlling microchip during it's higher consumption state, thus further reducing losses.

FIG. 4 illustrates an embodiment of the present invention that may assist to reduce the losses due to the circuitry of controlling microchip when the SMPS is in an active state. When the SMPS is in an inactive state, the controlling microchip (18) may be powered via resistor (16) directly from the DC bus (15), which may be the rectified mains voltage. Resistor (16) may have a sufficiently large value to drop most of the voltage resulting from mains rectification at (14), for the current as consumed by microchip (18) in this state. A Zener diode and capacitor may be used to regulate the voltage applied at (17) to the supply pin of microchip (18). When the controlling microchip (18) senses a sufficient change in capacitance, or another parameter, it may turn the SMPS on, and in conjunction it may activate the alternative supply path at (20) via a control signal. Said supply path (20) will typically be optimized for minimum losses at the higher current drawn by microchip (18) and its associated circuitry during the active state of the SMPS. Additionally, an indication LED may be placed in series with path (20), which may further assist to reduce losses. When the SMPS is turned off again, microchip (18) may de-activate path (20) again, and resort to the trickle supply via resistor (16).

Figure 5:
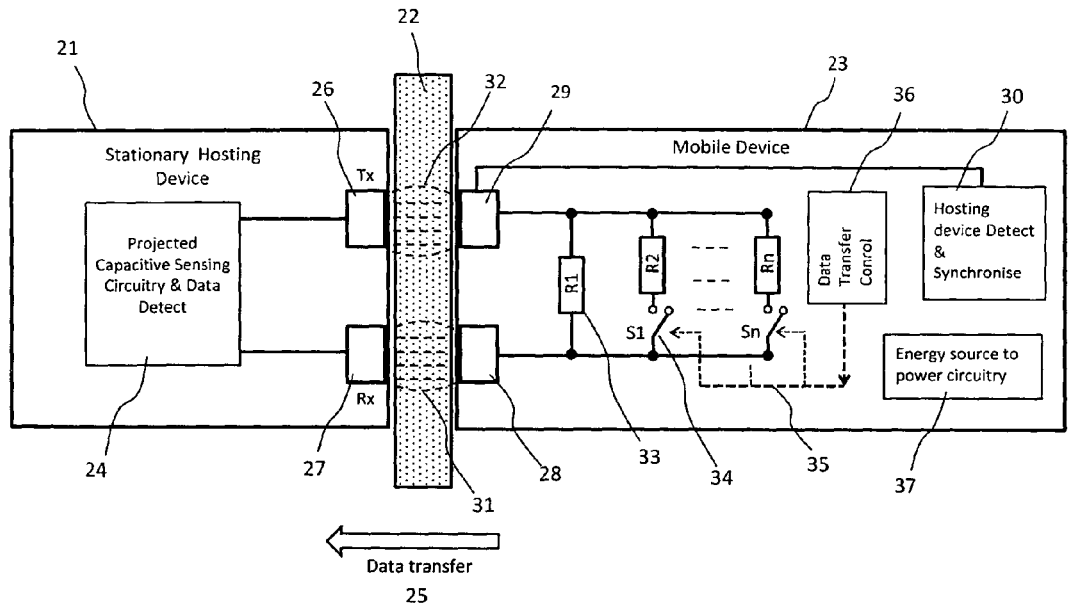
FIG. 5 shows an exemplary embodiment of the present invention that couples data onto the charge transfer cycles of a stationary host, enabling data transfer from a mobile device to a stationary host.
Figure 7:
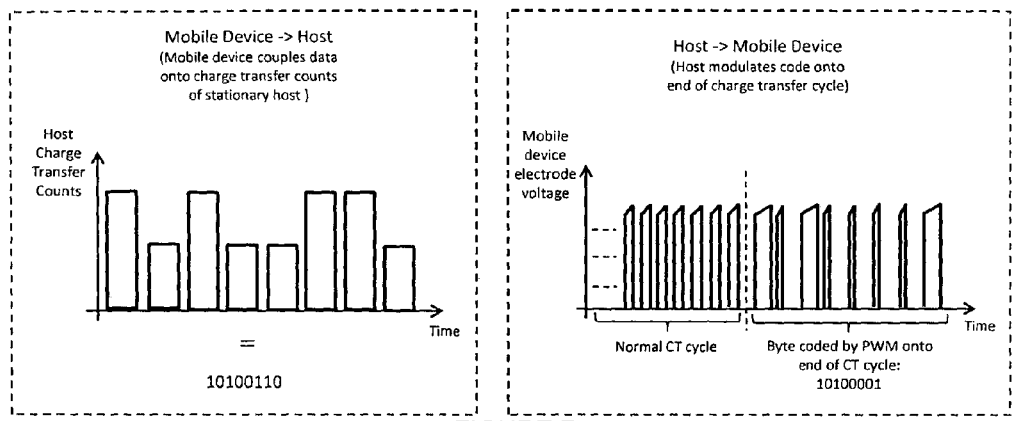
FIG. 7 shows exemplary capacitive sensing manipulation schemes for data transfer according to the present invention.

The present invention may also be embodied in capacitive sensing based data transfer between mobile devices and stationary hosts, for example as required to realize contactless universal charging docks or platforms for mobile electronic devices. FIG. 5 illustrates an exemplary embodiment for data transfer from a mobile device (23) to a stationary host (21) according to the present invention. It is based on the detection of the host CT capacitive sensing cycle by the mobile device. However, this is purely exemplary, and many other capacitive sensing techniques may be used and still fall within the allowable claims of the present invention. In the example shown, host (21) may typically effect charge transfers using Tx and Rx electrodes or sense plate structures (26) and (27) respectively. When mobile device (23) is in close proximity to host (21), separated by a plurality of dielectric barriers (22), it may affect said host CT process. This may be especially easy to explain if mobile device has complimentary electrodes such as (28) and (29) which are lined up with the Tx and Rx electrodes of the host. The mobile device may detect the presence of a host with CT, and the exact timing of the CT cycles quite accurately using electrode (29) and contained module (30). This may allow it to synchronize itself with the host's measurement cycle time base. When the mobile device (23) is in sufficient proximity (or sufficiently capacitively coupled) to host (21) and the complementary electrodes of host and mobile device are lined up, the CT counts of the host should change by an amount proportional to resistor R1. The host may use this to sense the presence of a mobile device which may need to transfer data. Since the mobile device may be synchronized with the CT time base of the host, it may switch a resistor, or a number of resistors, in or out using switches such as (34) during a specific CT cycle to transfer data. The switches are controlled from contained data transfer control module (36) via path (35). The sudden insertion or removal of impedance from the electric field path of Tx electrode (26) and Rx electrode (27) should cause an abrupt change in the number of CT counts measured per CT cycle by the host. The sequence of count changes in the CT cycles may be used by the host to detect the data from the mobile device. As shown in FIG. 7, for example a downward change in counts may represent a binary zero, and an upward change a binary one. If no change occurs, the previous value is maintained. Alternatively, the host may detect data from the mobile device based on relative level. That is, for example a high level represents a binary one, and a low level a binary zero. A third alternative is to ascribe specific messages to specific count levels at the host. In other words, the mobile device may switch a specific resistor in to relay a specific message to the host, and another resistor for an alternative message, and so forth. This last method is more of an AM method and would be highly sensitive to noise. Said mobile device may be self-powered with its own energy supply, for instance an exhaustible supply such as rechargeable batteries, shown by (37).

Figure 6:
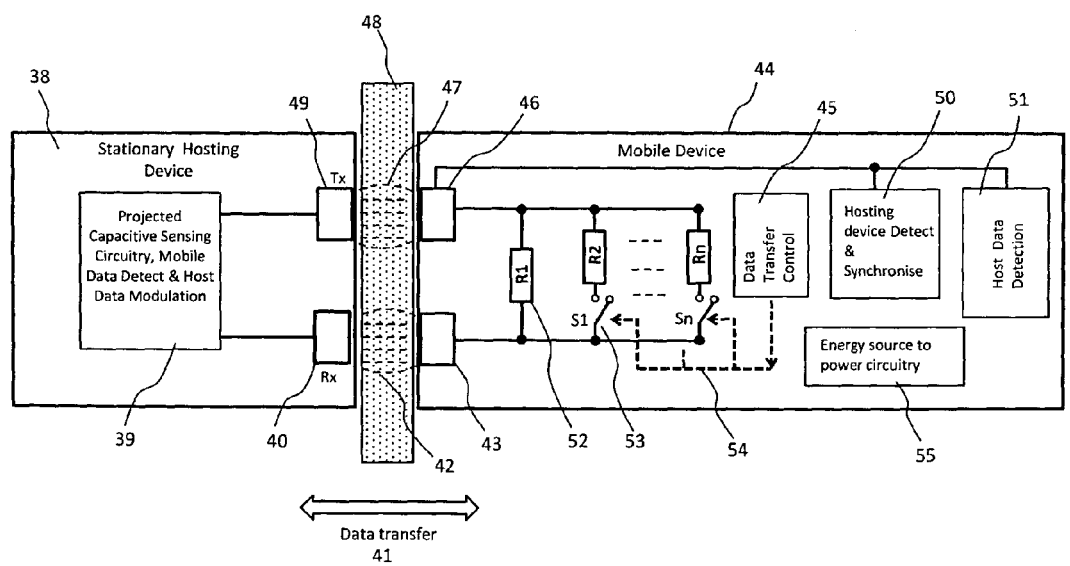
FIG. 6 shows an exemplary embodiment of the present invention that couples data onto the charge transfer cycles of a stationary host, enabling data transfer from a mobile device to a stationary host, as well as the modulation of data into the pulse widths of a CT cycle, thus enabling data transfer from stationary host to mobile device.

The presently disclosed invention also teaches the realization of bi-directional communication between a stationary host and a mobile device, as illustrated in exemplary manner in FIG. 6. As disclosed in the preceding discourse, data is transfer from mobile device (44) to stationary host (38) by manipulation of the counts of the host's CT capacitive sensing. To allow bi-directional communication, the host also needs the ability to send data to the mobile device. According to the present invention, this may realized by the inclusion of a PWM (or other method) coded sequence at the end of a CT cycle, or at another point in the CT cycle. Since mobile device (44) may be synchronized to the CT cycle of the host (38), it may be able to monitor pulse widths accurately. One exemplary method to transfer data from the host to the mobile device, according to the present invention, may function as follows. At the end of a CT cycle, host module (39) may transmit a pulse longer than usual, and of a specific width. This may be detected by host data detection module (51) of mobile device (44). Hereafter, the host may use a wide pulse to transmit a binary one and a narrow pulse to transmit a binary zero to the mobile device, for example. The basic concept is further illustrated in exemplary manner in FIG. 7. (NRZ, Manchester and other coding schemes may also be considered.) The preceding is purely given to clarify the present disclosure, and not with limiting intent. Many other manipulation schemes for data transfer from host to mobile device may be possible that fall under the teachings of the present invention. For instance, it may be possible, according to the present invention, to have Tx and Rx electrode pairs on both sides, that is at both the host and the mobile device, and also have switchable resistor or impedance banks at both ends. Communication may be on half or full duplex basis, using sudden changes in measured CT counts, or through PWM coded sequences situated into the CT process. It should also be noted that the mobile device may be self-powered, with a contained energy source, for example rechargeable batteries, as shown at (55).

Figure 8:
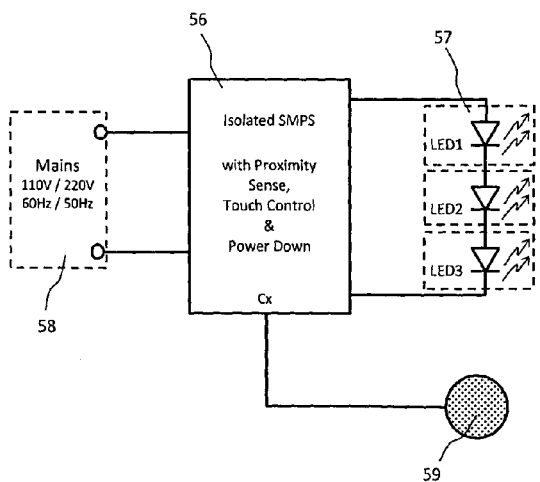
FIG. 8 shows an exemplary embodiment of the present invention that utilizes a capacitive sensing enabled controlling microchip to control a SMPS for an LED lighting fixture.

FIG. 8 illustrates an exemplary embodiment of the present invention used in a lighting fixture product that employ a string of LED's (57). A mains powered isolated SMPS with electronics (56) exists which may have the ability to detect touch and proximity events, and which may be turned off during prolonged periods of inactivity and may be returned to an active state when a proximity/touch sensing event via electrode or sense plate structure (59) occurs. The table in FIG. 8 summarizes the various states. The user may also directly control the power output of the SMPS, and therefore the lighting intensity, via touch control. The embodiment illustrated should be more energy efficient than similar touch controlled LED lighting fixtures held by the prior art, as it allows the SMPS to completely power down, with only a very small amount of power drawn by the capacitive sensing circuitry via an alternative supply path during prolonged periods of inactivity. It may also help to reduce cost through savings on switching components, for example that can be used to dim the LED lighting by introducing a PWM sequence in the LED circuit.

Figure 9:
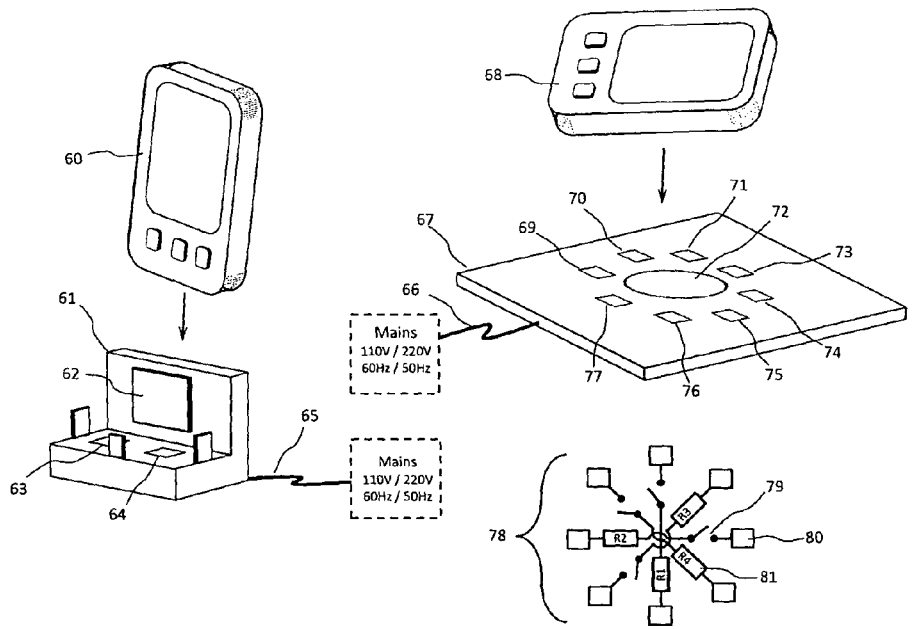
FIG. 9 shows an exemplary embodiment of the present invention which realizes contactless charging in a robust and low cost manner for a cellular telephone.

FIG. 9 presents an exemplary embodiment of the present invention that may allow the realization of robust universal charging stations for mobile electronic devices that may be cost-effective in terms of both money and energy. In the example shown, a cellular/mobile telephone (60) typically needs only to be placed in the charging dock (61) to commence contactless charging over an air interface. Electrodes (63) and (64) may be a Tx and Rx pair, used for CT based capacitive sensing by the hosting dock (61). Said dock may be mains powered, as indicated at (65), and contain a SMPS of which the controlling microchip may utilize electrodes (63) and (64) for capacitive sensing. After a prolonged period of inactivity, the SMPS of the docking station may be turned off, to conserve power. When a cellular phone such as (60) approaches the dock, its proximity should be sensed, and the SMPS may be returned to an active state. When the phone is placed in the dock, complementary electrodes on the mobile telephone (not shown) are aligned with electrodes (63) and (64). The mobile phone may therefore transfer data relevant to the charging process to the hosting dock, using methods as disclosed in the preceding discourse. The data relevant to the charging process may for example be the type of battery, it's size, charging limits and so forth. Once the battery on the phone has been identified, charging may commence via an inductive energy transfer system, of which one half is shown by (62). Such energy transfer systems are well known in the prior art. The telephone should contain a complementary circuit to capture and process the magnetic fields emitted by (62). It should be understood that the invention is not limited to inductive energy transfer techniques, but may be employed with any relevant contact or contactless energy transfer technique. Once the battery of telephone (60) is fully charged, it may signal this condition to the hosting dock via the capacitive CT based data interface. The controlling microchip will then ensure that charging cease, and may turn the SMPS off until the phone signals that it's battery has lost some charge, or the phone is removed, and replace with another phone. The embodiment as described may hold the significant advantage that a mobile telephone may be left in the charging dock almost indefinitely, without excess power consumption by the charger, or unacceptable battery charge loss. Further, the embodiment may allow the charging dock to be used in a universal manner with a large number of different mobile telephones, with the only requirement that said telephones are fitted with circuitry to modulate data onto the host capacitive sensing process, and have some sort of inductive energy pickup connected to their batteries.

FIG. 9 further shows an exemplary embodiment of the present invention that realize a flat charging platform (67) for a cellular or mobile telephone (68), with said platform that may be largely insensitive to the orientation of said telephone, as long as the correct face of the telephone is against the platform. Charging platform (67) may be mains powered, as shown at (66), and contain a SMPS of which the controlling microchip may also have capacitive sensing abilities. Capacitive sensing electrodes (69), (70), (71), (73), (74), (75), (76) and (77) may be arrayed around an inductive charging interface (72). It should be understood that the embodiment is not limited to inductive charging interfaces, but may also apply to any other relevant contact or contactless charging interface. After initial power-up, the controlling microchip of charging platform (67) may switch the SMPS off after a prolonged period of inactivity. Upon approach of a mobile telephone, the controlling microchip may sense its or a user hand's proximity, and turn the SMPS back on. When said telephone is placed on said platform, the controlling microchip may sense the orientation of the telephone using the array of electrodes. Once this has been determined, the controlling microchip may use one or an opposing set of electrodes to obtain data from the telephone, or send data to it, using manipulation and coupling techniques as disclosed during the preceding discourse. Hereafter, charging may commence and cease as described in the previous discourse. Therefore, the illustrated embodiment may allow a user to place his/her telephone on the charging platform without having to align it with a specific direction. Also shown in FIG. 9, at (78), is a manner in which an ostensibly circular array of opposing electrodes may be connected with specific resistances to couple data onto a CT process. Such an array may be contained in either the mobile phone or in the charging platform.

Figure 10:
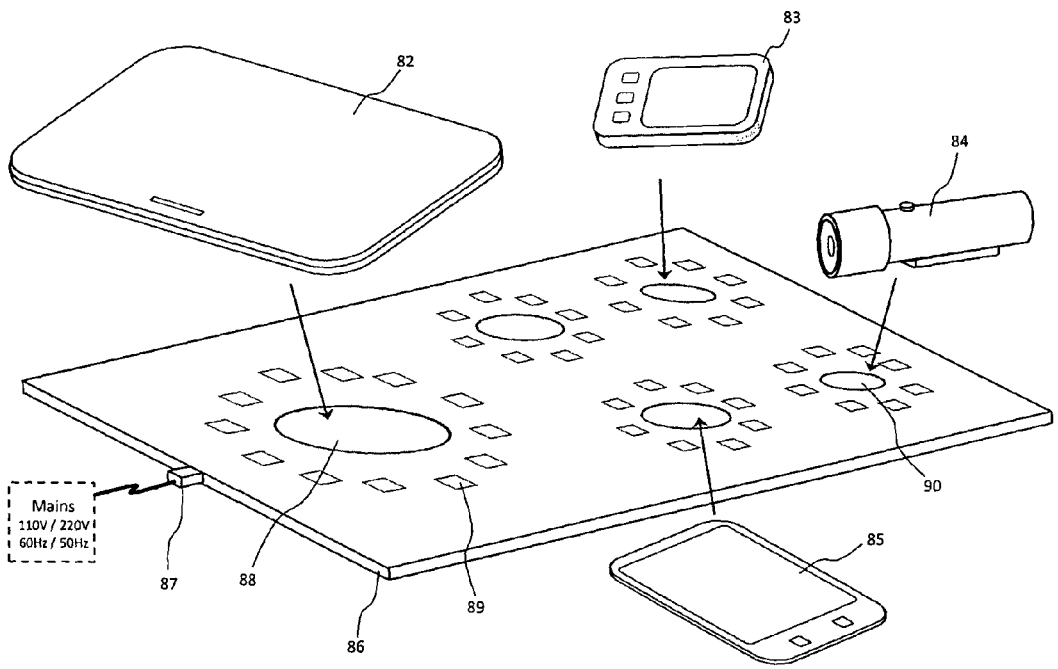
FIG. 10 shows an exemplary embodiment of the present invention which realizes a universal charging platform of area, where a large number of mobile electronic devices may be charged without complexity.

If the universal charging platform embodiment of the present invention, as shown in FIG. 9 is taken one step further, a multi-device universal charging platform as shown in FIG. 10 may be contrived. In the exemplary embodiment of the present invention shown by FIG. 10, a large number of mobile electronic devices, of varying sizes and shapes, may be charged by simply placing them onto platform (86), in any orientation, as long as the correct face of the device is against the platform. For instance, it may be possible to simultaneously, and without complexity, charge a laptop (82), a mobile telephone (83), an LED torch (84) and an e-Reader (85). The only requirement is that all these devices have capacitive sensing circuitry and electrodes on the correct faces, can detect and manipulate the capacitive sensing process of the platform to transfer required data, and have some sort of inductive energy pickup connected to their batteries. As before, charging platform (86) may be mains powered, as at (87), and incorporate a SMPS with a controlling microchip that has capacitive sensing abilities, which monitors electrodes such as that shown by (89) for device detection, and data demodulation. When prolonged periods of inactivity occur, or the devices present have been fully charged, the SMPS may be turned off by the controlling microchip, to conserve power, and may be returned to an active state when a legitimate proximity event occurs. FIG. 10 also shows that the platform may be divided into sections for different mobile device sizes, and that the inductive energy transfer circuitry, as illustrated at (88) and at (90), may be sized accordingly, along with the capacitive sensing electrode arrays. Naturally, as before, the present invention is not limited to inductive energy transfer for charging, but may employ any relevant contact or contactless energy transfer method. The structure may also be such that any device may be placed at any position and the charging will be arranged in accordance with the data transferred.

Figure 11:
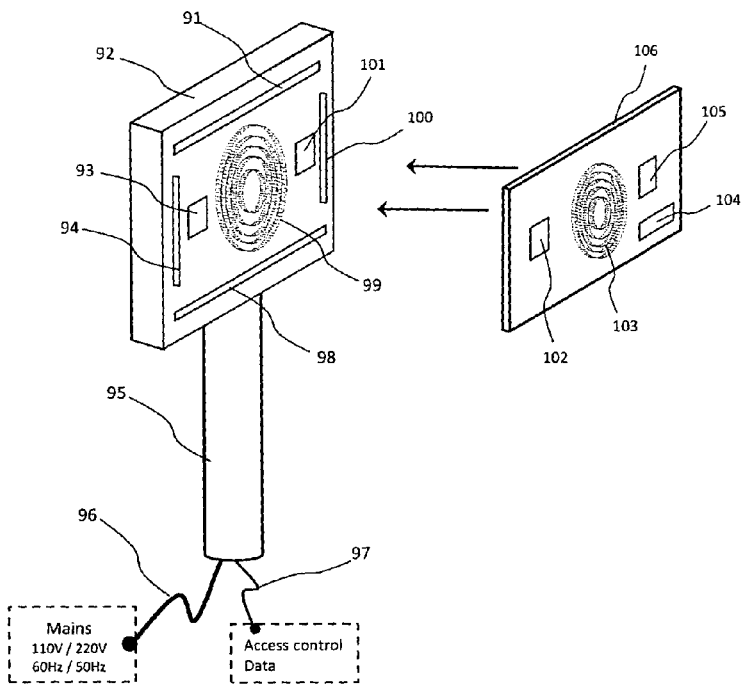
FIG. 11 shows an exemplary embodiment of the present invention in the form of an access control system.

FIG. 11 shows yet another exemplary embodiment of the present invention that may potentially be used to realize a cost-effective, energy efficient and secure access control system. A hosting card reader (92) may be situated on a pole (95) close to the access point being controlled. Said card reader will typically be mains fed, and may employ a SMPS. According to the present invention, the microchip controlling the SMPS may have capacitive sensing abilities, and may be connected to capacitive sensing electrodes or sense plate structures (93) and (101). The SMPS may be used to power inductive energy transfer coil (99), which may be used to power access card (106). If a prolonged period of inactivity occurs, said controlling microchip may turn the SMPS off, thus conserving power. Said microchip may then continue to monitor electrodes (93) and (101), or other sensors, for a specific change in sensed capacitance, or another parameter, with minimal losses. When a user's hand holding an access card (106) approaches card reader (92), the controlling microchip may detect a proximity event, and may turn the SMPS back on, with inductive energy transfer coil (99) consequently being re-energized. If a user places card (106) close to or against card reader (92), guided by protrusions (91), (94), (98) and (100), the card may be powered inductively via coils (99) and (103). Circuitry (104) on the card may include the ability to process the inductively received energy, and data transfer ability via electrodes (102) and (105). Communication may be uni-directional from the card to the reader, or bi-directional, using the capacitive sensing data transfer techniques as disclosed during the preceding discourse and electrodes (93), (101), (102) and (105). Once the card reader has authenticated the card, or performed other required secure transactions, access may be granted by transmission of the relevant access control data via cable (97) for further processing.

The above disclosed embodiment may have the additional benefit of not being too constrained in the frequency of the signal on the energy transfer coils, unlike the case when these coils are also used to transmit data, as in prior art HF inductive energy access control systems. This benefit may ensure that the coil and energy transfer can be optimized for a number of criteria, such as losses, transfer distance, EMC etc. Naturally, the present invention is not constrained to inductive energy transfer between reader and card, but may utilize any relevant energy transfer technique, be it based on galvanic contact or contactless. In addition, self-powered active cards may also be used for access control according to the premises illustrated in FIG. 11.

Using capacitive sensing based data transfer methods as described in the present disclosure for secure transactions over plurality of dielectric barriers should limit the possibility of criminal or inadvertent interception of data. Due to the nature of capacitive sensing circuits, field strengths decay extremely fast with distance, implying that it may be very challenging to intercept transferred data illegally.

Further, the concepts as presented may be extended to any device with a touch screen. According to the present invention, secure transactions may be performed by using a touch screen enabled device as a reader to authenticate for instance a self-powered smart card, using capacitive sensing based data transfer as disclosed in the preceding discourse. Or the mobile device (smart phone, tablet pc, PDA etc) with touch screen can authenticate a token, or itself may be used as a smart token, and used to authenticate a transaction taking place on a stationary host which has capacitive sensing abilities, and which may, or may not, employ SMPS control according to the premises of the present invention.

It may for example be possible to implement a capacitive sensing track pad for use with a PC and that can then be used to authenticate a token.

In case of a mobile phone, the token may communicate with the phone in accordance with the capacitive data transfer technique disclosed herein and the token may be energized with a battery, inductively charged or even using the mobile phone Radio Frequency (RF) radiation signals to supply sufficient power. The advantage and objective is to use standard devices without requiring any special modifications or adjustments in the existing hardware.

Figure 12:
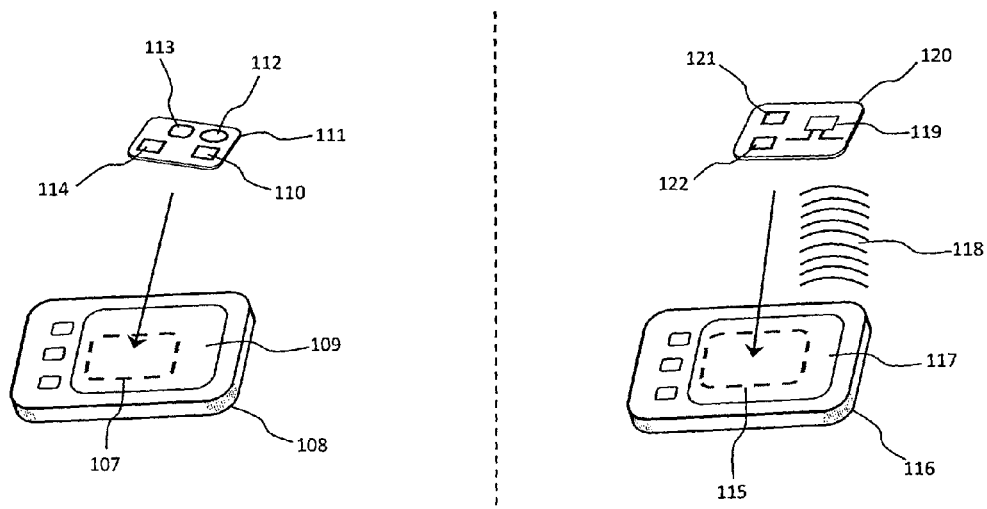
FIG. 12 shows an exemplary embodiment of the present invention using the touchscreen of a mobile phone to authenticate a token to enable a highly secure transaction.

FIG. 12 illustrates two exemplary embodiments of the present invention that utilize the touch screen of a mobile phone to authenticate a token during a highly secure transaction. Mobile telephone (108) employs a touchscreen (109) with capacitive sensing technology. The security of transactions performed with said mobile phone may be greatly increased if dedicated token is required to authenticate the user of the telephone, and the transaction. Such a token (111) may be realized according to the teachings of the present invention on capacitive data transfer. When token (111) is placed onto touchscreen (109), for example in the area demarcated by (107), electrodes (110) and/or (114) of the token may be used to detect the, for example, CT process of said touchscreen, and synchronize the token's time base to it. This may be followed by uni- or bi-directional data transfer, according to the methods taught by the present invention, and laid open during previous discourse of this disclosure, to authenticate the token, and thereby the user and the transaction. Said token may be powered from an exhaustible supply, for example a battery, as shown by (112) in FIG. 12. Circuitry (113) may be included in token (111) to regulate the power being supplied to the rest of the circuitry of the token.

Also shown in FIG. 12 is an alternative method, according to the present invention, to power a token (120), which may be used to authenticate a user and a secure transaction taking place on mobile telephone (116). An antenna structure and energy processing circuitry (119) is included in token (120). Said antenna and energy processing circuitry is specifically adapted to harvest RF-energy (118) emitted by mobile telephone during it's normal operation, also during said transaction. Once sufficient RF-energy has been harvested, token (120) may detect the capacitive sensing process of touchscreen (117) via it's electrodes (121) and/or (122), and synchronize itself to it, if placed sufficiently close to touchscreen (117), for example in demarcated area as shown by (115). This may be followed by a secure data transfer process to authenticate the token, the user and said transaction, using capacitive sensing based data transfer techniques as taught by the present invention.

Figure 13:
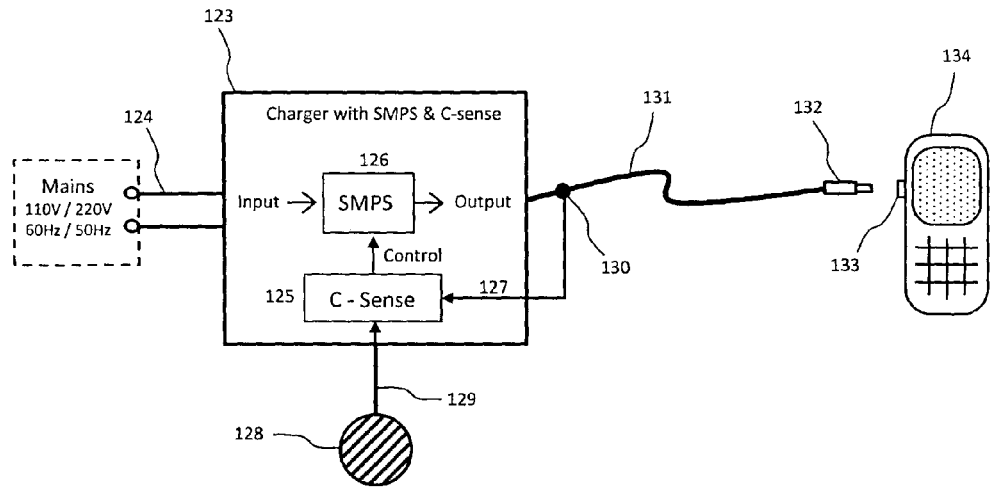
FIG. 13 shows an exemplary embodiment of the present invention that uses capacitive sensing via a load cable to detect possible reconnection of the SMPS load, in this case a cell phone battery and it's charging circuitry.

In FIG. 13 an exemplary embodiment of the present invention that implements capacitive sensing with the load cable of a cell phone as electrode, is presented. Charger (123) follows the above teachings of the present invention, and has an SMPS controller (125) that not only controls SMPS (126), but also has capacitive sensing ability. Typically, a capacitive electrode (128) is connected to controller (125) via an interconnect (129), with said controller monitoring the capacitance of said electrode. In some instances, electrode (128) will be on or in close proximity to the body or enclosure of charger (123), making it difficult or impossible to sense capacitance changes due to user actions that are taking place at the end of load cable (131). For example, if SMPS (126) has been placed into a low power, non-switching inactive state due to no load being connected for an extended period, and the user connects a cell phone (134) to load cable (131) via connector (132) and jack (133), controller (125) may not sense a qualifying change in capacitance due to user being at the load end of load cable (131), which may be one cable length away from the charger. This may result in cell phone (134) not commencing charging, and forcing the user to physically relocate, and capacitively engage electrode (128) to return SMPS (126) to an active mode. To overcome this drawback, the present invention teaches that load cable (131) may be used as capacitive sensing electrode, with a capacitive measurement channel (127) of controller (125) connected to the load cable at point (130). When the user or a load engages load cable (131), a change in capacitance should result, which may be monitored by channel (127), and assist controller (125) with the decision whether or not to return SMPS (126) to and active state. The present invention further holds that controller (125) may monitor either load current flowing in load cable (131), or the current drawn at the input of SMPS (126), in this case from the mains utility network via cables (124), and use this information in conjunction with the sensed capacitance of the load cable to determine whether SMPS (126) should be returned to an active switching state.

Figure 14:
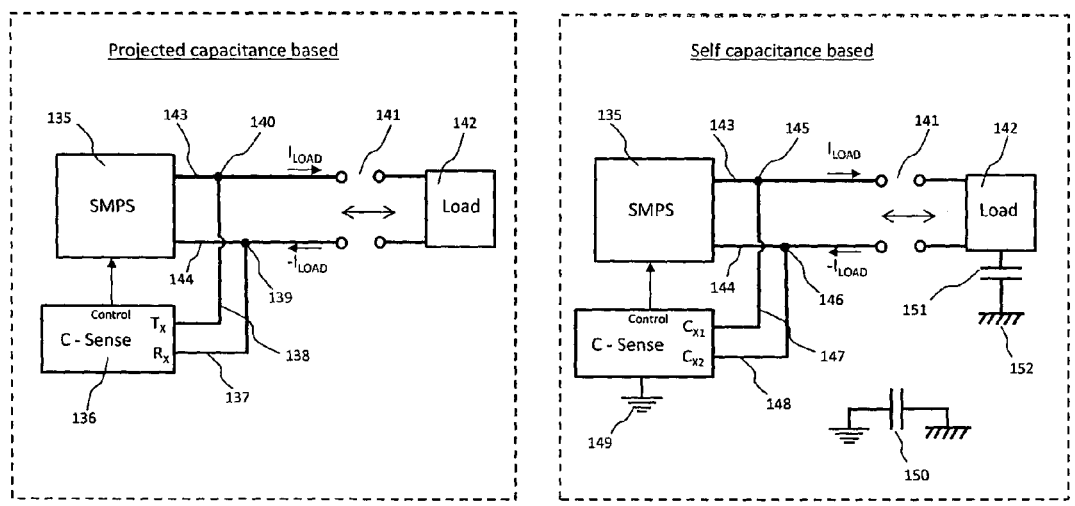
FIG. 14 shows the exemplary use of either projected or self-capacitance measurements on a load cable to detect possible SMPS load reconnection.

The manner in which the load cable of a SMPS is used as capacitive sensing electrode may differ, according to the present invention, and shown in exemplary manner by FIG. 14. A large number of capacitive sensing, or other sensing methods, may be employed with the load cable acting as sensor electrode or sense plate structure. In FIG. 14, two examples are shown, one using projected capacitance measurements, and one using self-capacitance measurements. In the projected capacitance example, a SMPS controller (136) has a transmitting (Tx) pin and a receiving pin (Rx), to perform projected capacitance measurements, as is well known in the art of capacitive sensing. According to the invention, said Tx pin may be connected to one of the wires (143) in the load cable at point (140), via connection (138). Conversely, said Rx pin may be connected to the other wire (144) in the load cable at point (139), via connection (137). If a load (142) engages the load cable via connector (141), or if the user engages the load cable by touching it, or being in very close proximity, the capacitance measured by controller (136) should change. This may be used to assist with the decision whether or not to return SMPS (135) to an active switching mode.

An alternative exemplary embodiment using self-capacitance measurement is also shown by FIG. 14. In this case, a single self-capacitance measurement channel Cx1 of the disclosed SMPS controller may be connected to the load cable (143) at point (145), using interconnection (147). If a load (142) engages the load cable via connector (141), or a user sufficiently engages the load cable, the self-capacitance measured by said controller should change measurably. As shown, load (142) has a certain capacitance (151) to the local electrical earth (152), and said earth is capacitively connected via distributed capacitance (150) to the ground reference (149) of the SMPS controller. A user also exhibits a certain capacitance to the local electrical earth. However, the use of a self-capacitance measurement technique to monitor the capacitance of the load cable need not be constrained to a single Cx channel. As shown in FIG. 14, multiple capacitance measurement channels may connected to the load cable, for instance channel Cx2 may be connected to wire (144) of the load cable at point (146) using interconnect (148) as well.

Figure 15:
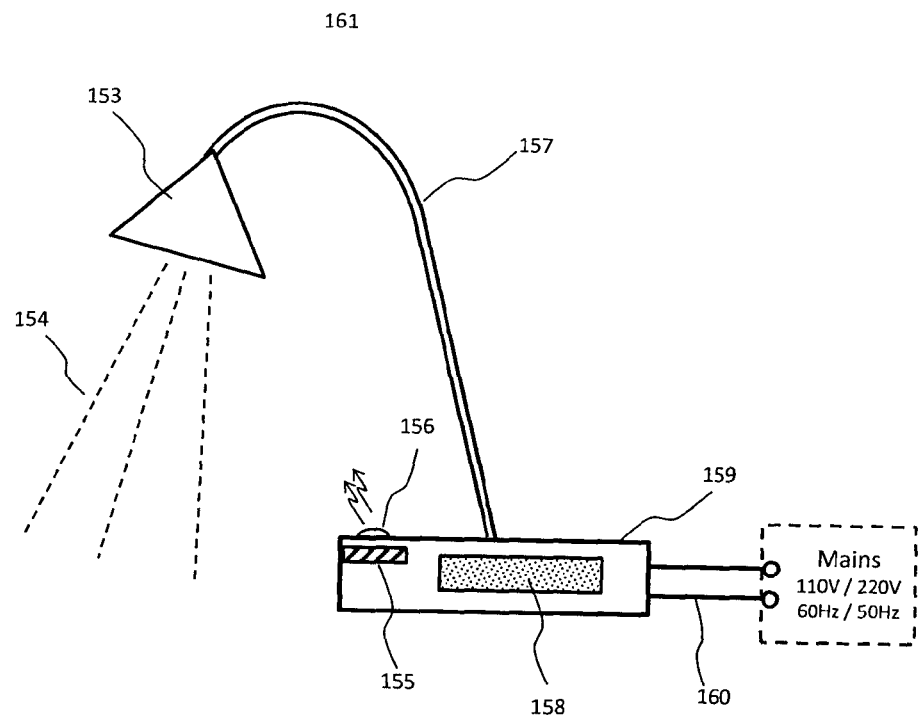
FIG. 15 shows an exemplary embodiment of the present invention in the form of a desk lamp, with the body of the lamp used for proximity detection, and a dedicated controlling touch interface which may be illuminated on user proximity.

FIG. 15 shows yet another exemplary embodiment of the present invention. An electronically controlled desk lamp (161) is powered from the mains utility network via cables (160), and contains a SMPS or converter with an integral capacitive sensing controller (158), a capacitive sensing electrode or sense plate structure (155) and an illumination device (156) in its base (159). A stem (157), which may typically be flexible, connects a lamp head (153) to base (159). Head (153) projects light onto a surface, as shown by (154). When lamp (161) is in an off state, only the capacitive sensing part of the controller will be running, with the SMPS placed in a non-switching, inactive state, with quiescent current that may typically be in the micro Ampere range. In this state, said controller monitors the environment of the lamp for a qualifying capacitive proximity event. Once such an event has been detected, said controller will switch on illumination device (156), to guide the user to the touch interface of the lamp, that is, a FITD indicator is switched on. Said illumination device (156) may have a transparent or semi-transparent cover out of a non-conducting material, and is situated directly over the capacitive sensing electrode (155) in a vertical sense. The controller may at this stage allow illumination device (156) to be powered via a high impedance path directly from the rectified mains voltage, similar to the controller itself, as described during previous discourse of the present invention, or it may return the SMPS to a switching active or semi-active state, and power illumination device (156) from a SMPS output. To activate the main light source contained within lamp head (154), the user may have to touch the illumination device (156), which have been illuminated, within a predetermined period from said proximity event. Said touch may be sensed via sensing electrode or sense plate structure (155) directly underneath illumination device (156), with said electrode in turn connected to the capacitive sensing circuitry integral to the SMPS controller contained in (158), as per the teachings of the present invention. Operation of the main light source in head (153), and control of the amount of light emitted, may be done via various touch sequences or methods. Capacitive sensing electrode (155) may be a projected capacitance sensing type, with separate Tx and Rx electrodes, as is well known in the art of capacitive sensing. Or it may be a single electrode used for self-capacitance measurements. If the former electrode type is used, it may be more immune to changes in the electromagnetic environment of the lamp, allowing more accurate touch detection. For proximity detection, the disclosed embodiment may use the complete lamp body, including base (159), stem (157) and head (153) as a self-capacitance electrode. Because the SMPS will typically be in a non-switching inactive state during proximity sensing, the inherent noise of the SMPS will not be present, which may allow highly sensitive capacitive sensing.

Figure 16:
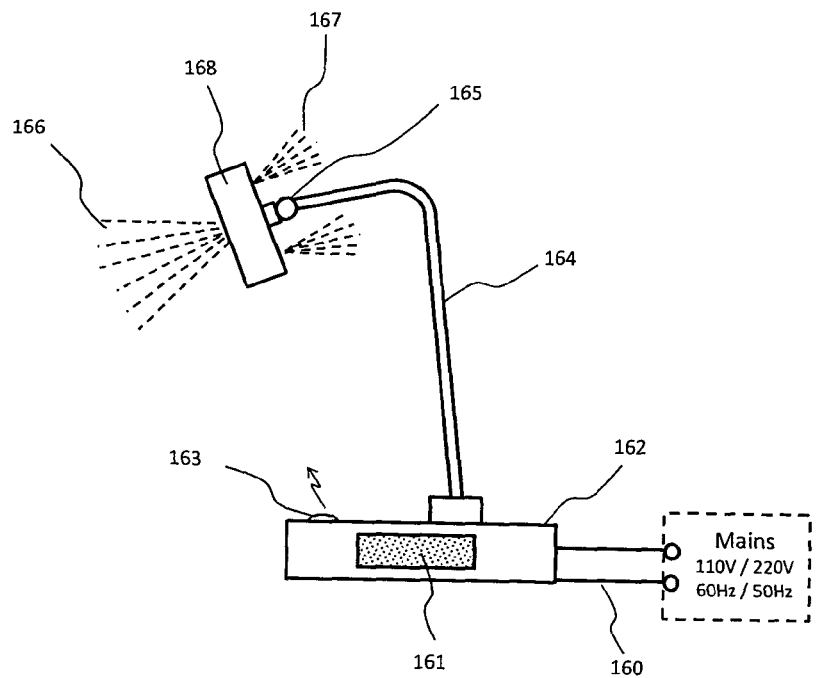
FIG. 16 shows an exemplary embodiment of the present invention where multiple light sources in a desk lamp is controlled via a capacitive sensing interface.

FIG. 16 shows yet another embodiment where an exemplary LED lamp is shown with dual types of light sources/ light generating loads. The main (or reading) light source (166) comprising a single or multiple LED(s) or other light source type and a secondary light source (167) comprising an LED or LED's for ambient lighting.

As such the lamp can be used for normal reading or similar purposes or can be used for mood lighting, or in fact both if so desired.

The user interface can be configured to control both types/sets of light sources together or separately. The secondary light may for example be colors like red, blue, green etc or may be controlled to be under user control. So that the user can select a color from for example typical RGB combinations. The user interface may present a memory option to save a selected color or intensity level for future usage when the lamp is activated.

The user interface switches may comprise a single proximity sensor (any or all of 162, 164, 168) and a single physical contact activation sensor (163). But it may also comprise multiple touch activation sensors. For example one for the secondary light (167) and one for the main light (166). This will allow separate control for the lights in order to activate a specific light or to set the activation intensity levels individually.

Both may also be individually settable but may operate simultaneously when the light is activated in a simple operation.

In further embodiments the light may be combined with timer or adjustable alarm clock functionality to automatically give more red light or blue light during the appropriate times. It may also allow for automatic gradual intensity increase in the morning when a user must wake up, that is when said alarm is activated. This action may also be accompanied by automatic coloration changes for natural effects. The present invention also teaches that a proximity gesture may be used to activate a snooze function for said alarm clock of said lamp embodiment.

In a simple embodiment the secondary light intensity may be directly related to the intensity of the main light and a single activation electrode may suffice.

In a further embodiment the user interface may comprise a swipe electrode and wherein the direction of the swipe will select the specific light (166 or 167) to activate or adjust. Combinations of swipe and touch functions along with timing may be used to implement the appropriate user interface.

A single or multiple hinges (165) may be used to direct the light from the light sources. Lenses for collimation and dispersion may be used.

The switch mode power supply (161) may be implemented, according to embodiments of the present invention as disclosed by the preceding discourse, to use the exact knowledge from the light sources activated and intensity levels set to optimize power consumption. For example it may be possible to keep the switch mode power supply in a low power state if the secondary light alone is activated in a very low power level.

In a further embodiment the light sources may be individually or in combination be synchronized with a music or audio system built into the base unit (162). The present invention includes the method of changing the intensity and color content of at least one light source of the disclosed lamp according to the audible content in the vicinity of the lamp, whether this audio is emanating from the base of the lamp, played by another audio system close by, or other sources further afield. Apart from an ambient lighting function, for instance at a social event, such a feature of the disclosed invention may also be used to alert the deaf to sudden changes in their environment, which may be used for security.

A time-out (auto off) function may be selectively implemented on one or both light sources. That is, said timer also facilitates an automatic deactivation of said light generating load after a predetermined period has elapsed without any user intervention. One light source may be activated through touch on the base (162), whilst the other may have a separate activation electrode, for example on the "head" (168) or on the base (162).

Figure 17:
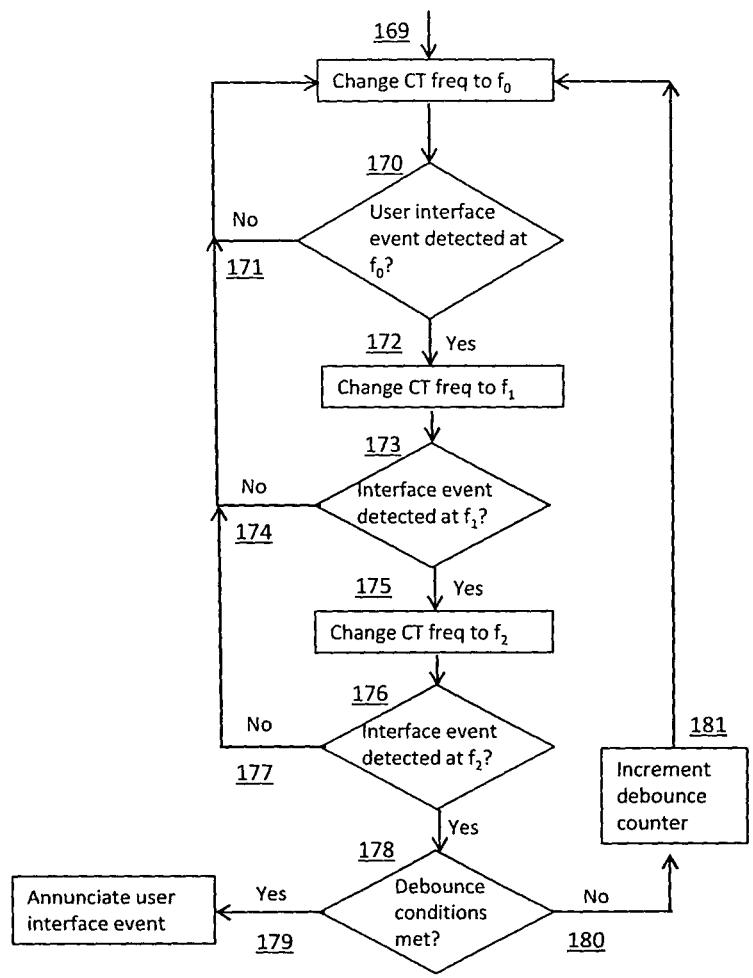
FIG. 17 shows an exemplary flowchart that describes a typical process that may be used to implement a multiple discrete frequency qualifying method to increase capacitive sensing noise immunity, as disclosed by the present invention.

In FIG. 17, an exemplary flowchart that may be used to implement a process which increases noise immunity, as held by the present invention, is presented. Said flowchart is largely self-explanatory, but in the interest of clear disclosure, it will be further explained. The process starts at (169) by changing the charge transfer (CT) frequency to a first frequency $f_0$. At (170), if no user interface (UI) event, such as a touch or proximity gesture, is detected via the relevant capacitive sensing electrode/s at said $f_0$, the frequency is kept at $f_0$, by a return (171) to the start. Once a UI event is detected at $f_0$, the CT frequency is changed to a new frequency, $f_1$, shown at (172) following by testing (173) for said UI event at $f_1$. If no UI event is detected at $f_1$, the process returns (174) to the beginning, (169), and sets the CT frequency to $f_0$ again. If said UI event is detected at $f_1$ as well, (175), the CT frequency is changed to a third frequency $f_2$. This is followed by testing (176) for said UI event at $f_2$. Once again, if no UI event is found at $f_2$, the process returns (177) to the beginning (169), and sets the CT frequency to $f_0$ again. If said UI event is detected at $f_2$ as well, (178), the process tests to determine the number of times said UI event has been detected at $f_0$, $f_1$ and $f_2$, with a certain minimum required. This debouncing requirement is used to further improve the noise immunity, and to guard against spurious events causing false declarations. If the minimum number of times for UI event detection at $f_0$, $f_1$ and $f_2$ is not met, (180), the process returns to the beginning, after incrementing the debounce counter (181). If said UI event has been detected at $f_0$, $f_1$ and $f_2$ a sufficient number of times, it is annunciated, (179).

The claimed improved noise immunity of the above disclosed method is based on the observation that relevant narrowband noise, typically common mode conducted noise, seems to affect capacitive sensing mainly at the CT frequency, and harmonics thereof. Therefore, if noise is causing a false UI event detection at $f_0$, it will likely not cause similar false detections at $f_1$ and $f_2$, if the frequencies are chosen far enough apart. However, if a user executes a gesture, it will typically be detected at $f_0$, $f_1$ and at $f_2$, if the multiple frequency verification is done fast enough, and all frequencies are relevant to the measurement of human interface caused capacitance change.

The process presented in FIG. 17, and described above, is purely exemplary, and need not be constrained to three discrete frequencies, or the use of debouncing. Indeed, the present invention holds the use of any number of discrete frequencies to validate a capacitive sensing UI event, with a minimum of two frequencies applicable. Also, debouncing may or may not be used, and more complex debouncing techniques than the number or repetitions may be applied. Said process should also not be limited to charge transfer based capacitance sensing alone, but claims protection in any capacitive sensing application where multiple discrete frequency use, as disclosed, may be used to improve noise immunity.

Figure 18:
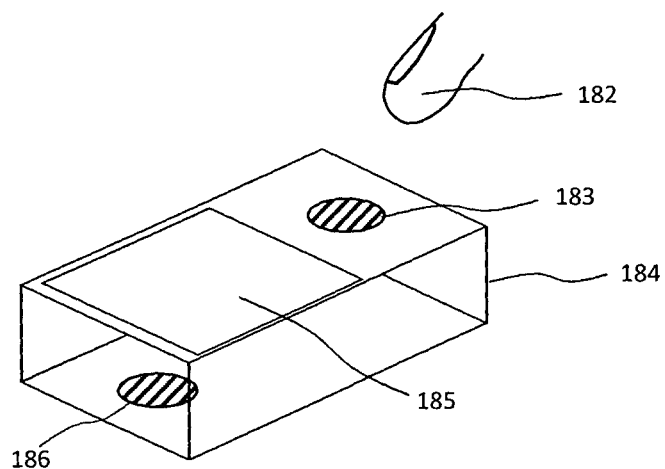
FIG. 18 shows an exemplary electrode arrangement that may be used to implement a noise detection or pick-up electrode, according to the present invention.

FIG. 18 depicts an exemplary capacitive sensing application that implements a noise detect or pick-up electrode, used to improve noise immunity, according to the teachings of the present invention. A user engages a capacitive sensing electrode (183) with a probe, typically a finger (182). If said probe moves close enough to said electrode, a touch or proximity event may be declared, respectively depending on a number of parameters. A noise pick-up electrode (186) is positioned well within product enclosure (184), typically beyond the capacitive reach of probe (182). To further ensure that a user may not falsely trigger a noise detect event, pick-up electrode (186) may be shielded by a ground layer (185), which may also be an actively driven shield, as is well known in the art of capacitive sensing. Therefore, any capacitance change beyond a certain minimum threshold measured for electrode (186) may be seen as noise. In one embodiment, UI electrode (183) and pick-up electrode (186) may use similar CT frequencies. In such an embodiment, if a qualifying event is measured for electrode (186), a high likelihood exists that noise will also cause false UI event detection at electrode (183), and the declaration thereof. To prevent this, the present invention teaches that any change in the logic state of the output corresponding to electrode (183) may be halted or blocked as long as a qualifying noise event is detected by electrode (186).

Figure 19:
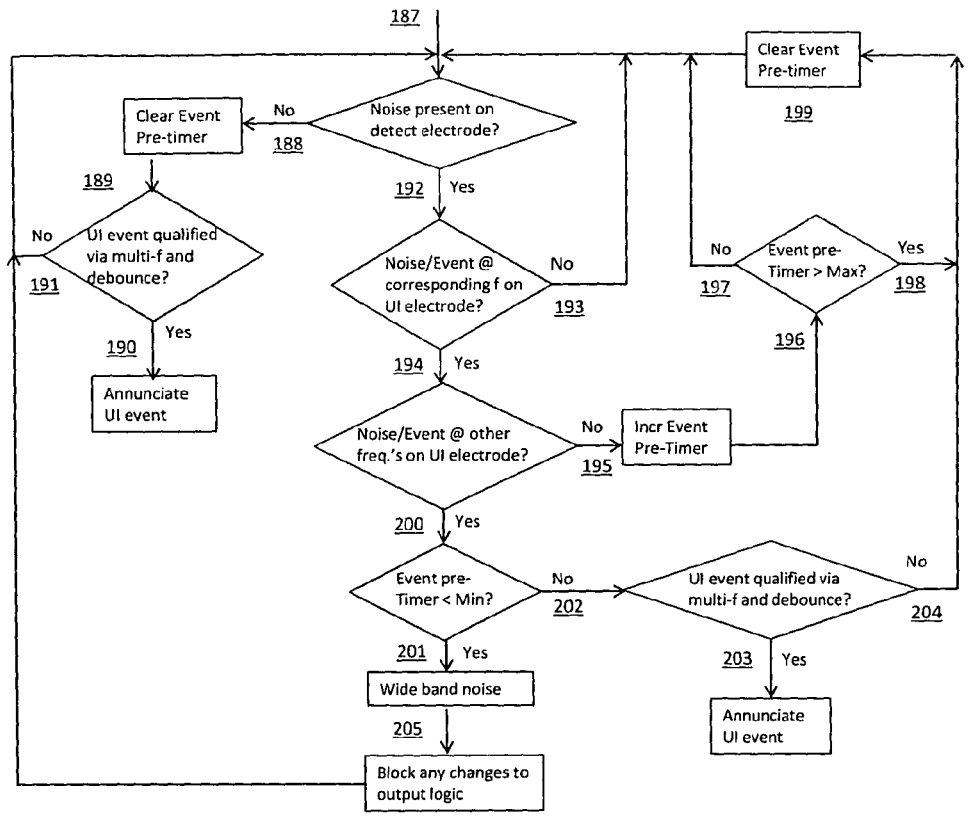
FIG. 19 shows an exemplary flowchart that describes a typical process that may be used to implement a method which uses a noise detection electrode in conjunction with multiple discrete frequencies to either qualify a capacitive sensing event, or block logic output state changes, according to the present invention.

However, such indiscriminate blocking may not be an optimum solution, as it also prohibits the user of interfacing with the hosting product via touch or proximity gestures if any noise is detected. Therefore, the present disclosure teaches the combination of the multiple discrete frequency method of FIG. 17 and a pick-up electrode method, as depicted in exemplary manner in FIG. 18. Such a combination may allow the user to interface via touch or proximity gestures in the presence of narrow band noise, and only block output logic changes when wide band noise is present. FIG. 19 depicts in exemplary manner a flowchart that describes the typical process followed when implementing such a combination of methods. Although mostly self-explanatory, the process described by said flowchart will be explained, in the interest of clear invention disclosure.

The process starts at (187) by testing whether noise is present on the detect or pick-up electrode. If no noise is present, (188), an Event Pre-Timer, is cleared. Said Pre-Timer is used in other branches of the flowchart to test for a minimum period, and thereby discern between wide band noise events, and user interface events, as mentioned during the summary of the invention. Once the Pre-Timer has been cleared, the process tests for a qualifying UI event, (189), using the multiple discrete frequency method illustrated by FIG. 17. If no UI event occurred (191), the process returns to the start at (187), and re-tests for noise on the pick-up electrode. If a valid UI event occurred, it is annunciated, as shown at (190).

If noise is detected via the pick-up electrode, (192), the process tests whether a qualifying event also occurred at the UI electrode at the same CT frequency used for the pick-up electrode. If no such event occurred, (193), the process returns to the start (187). If a qualifying event is present at the UI electrode at said same CT frequency, (194), the process tests whether said qualifying event at the UI electrode is also measured at the other discrete frequencies used, according to the present invention. If not, (195), the Event Pre-Timer is incremented, and checked against a maximum allowable value (196). If still below said maximum allowable value, (197), the process returns to the start, (187). If said Event Pre-Timer has exceeded the maximum allowable value, (198), it is cleared (199), and the process returns to the start, (187). An Event Pre-Timer that exceeds the maximum value simply means that narrow band noise has been present for a long period, without UI events, or wide band noise events occurring. It is cleared as a practical matter, as the processor used to implement said process cannot count indefinitely.

At (194), if qualifying events at the UI electrode are also measured using the other discrete frequencies utilized, according to the previously disclosed discrete multi-frequency technique, the process proceeds to test whether the Event Pre-Timer is less than a certain minimum value (200). If this is indeed found to be the case, (201), it implies that a qualifying event occurred at the UI electrode at all frequencies very soon after noise was first detected at the pick-up electrode at one of the frequencies. The chances of the user engaging the UI electrode at almost exactly the same time that a noise event engages and is detected at the pick-up electrode is very slim. Therefore, the result at (201) is interpreted as indication of wide band noise event occurring, resulting in all output logic changes being blocked, (205), and a return to the start, (187). If the wide band noise condition persists, the process will continue to follow loop (187)-(192)-(194)-(200)-(201)-(205)-(191)-(187), and output logic changes will continue to be blocked.

However, if the Event Pre-Timer is equal to or larger than said minimum, (202), the process proceeds to test whether the UI event qualifies in terms of multiple discrete CT frequencies and debouncing criteria, as disclosed earlier. This may be done, as sufficient time has elapsed between the occurrence and detection of a noise event at the pick-up electrode to allow the possibility that the user may engage the UI electrode, despite the presence of narrow band noise. (If it is wide band noise, the minimum period criterion will not be satisfied). If a qualifying UI event cannot be declared, (204), the Event Pre-Timer is cleared, and the process returns to the start (187). Conversely, a UI event is annunciated, (203), despite the presence of narrow band noise.

An extension to the above disclosed combined method is also taught by the present invention. Instead of using only one frequency to detect noise at the pick-up electrode, multiple discrete frequencies are used with the said pick-up electrode to discern between wide and narrow band noise. This lessens the reliance on a minimum period criterion, as disclosed above, and when combined with multiple discrete frequencies used to detect events at the UI electrode, may provide more information to help avoid false UI event annunciations. The present invention teaches that any number of discrete frequencies may be used for the pick-up electrode.

Figure 20:
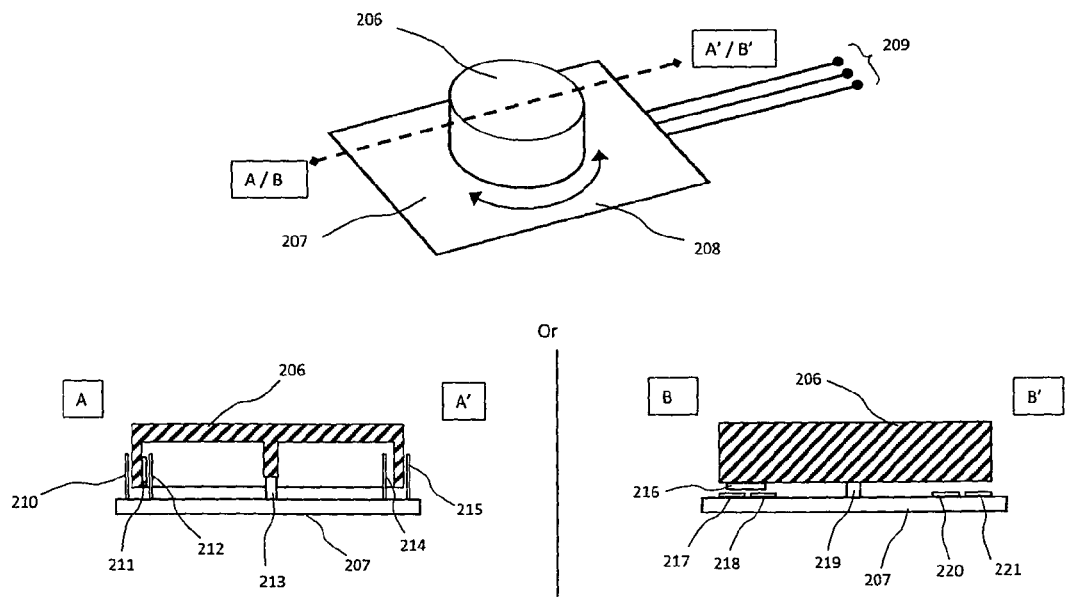
FIG. 20 shows a capacitive sensing based control knob according to the present invention.

FIG. 20 presents an exemplary embodiment of the present invention in the form of a capacitive sensing based control knob (206) mounted on a product or device surface (207). Said knob (206) can be turned in either direction, illustrated by (208) to facilitate control of a system, process, device, display or any of the myriad of applications of the prior art that employ control knobs. Control lines (209) extend from capacitive sensing circuitry, which may be mounted in the vicinity of said knob, to an interfacing circuit for further processing of control parameters, or control action execution. Typically, such control lines (209) will be used to communicate on a digital communication bus. Cross sections are also shown for two exemplary embodiments, to further clarify the present disclosure. For the first cross section AA', the knob (206) is hollow on the inside, with a central vertical pillar fitting onto a vertical axle (213), allowing rotation of said knob around said axle. The vertical side (215), without physically touching them or the horizontal product surface (207), i.e. it can rotate freely. In one embodiment of the present invention, electrodes (210), (212), (214) and (215) are used for mutual capacitance measurements, with electrodes (210) and (215) used as transmitter electrodes, and electrodes (212) and (214) as receiver electrodes. To facilitate measurement of the rotation of knob (206), an electrically floating member (211), which may be conductive, is fastened to a small section of said knob's vertical side wall. Typically, without placing a specific limit, member (211) will have dimensions comparable to that of a single pair of the capacitance sensing electrodes employed. It should be noted that the dimensions and shapes of the capacitance sensing electrodes do not have to be constant for the complete knob circumference, but may vary. When member (211) is situated between a transmitter electrode and a receiver electrode of a given pair, for instance between (210) and (212) as shown, it will affect the capacitance measured. If dimensioned correctly, the difference in measured capacitance with and without member (211) between a given electrode pair may be significant. Therefore, rotational movement of knob (206) may be measured by detecting relevant changes in measured capacitance for consecutive electrode pairs.

The second cross section BB' in FIG. 20 shows yet another exemplary embodiment of a capacitive sensing knob. Here, knob (206) is not hollow but more solid in nature, at least sufficiently so to provide a surface on its bottom side to mount an electrically floating member (216), which may be conductive, on. Said member (216) opposes electrode pairs mounted on product or device surface (207), for example illustrated electrodes (217), (218), (220) and (221). In the exemplary embodiment shown, electrodes (217) and (221) are used as transmitter (Tx) electrodes and electrodes (218) and (220) are used as receiver (Rx) electrodes, to facilitate mutual or projected capacitance measurement. Said knob (206) is mounted on a vertical axle (219), about which it may be free to rotate. As for the first cross section of FIG. 20, member (216) is typically dimensioned in such a manner that it only influences the capacitance measurement of a single or small number of electrode pairs. With correct spacing between member (216) and said electrodes, the presence of said member over a given electrode pair may significantly influence the capacitance of said electrodes, allowing measurement of knob (206)'s rotational movement in a manner similar to that described for the first cross section AA'. Although the preceding disclosures relating to FIG. 20 described mutual capacitance embodiments, it will be evident to those skilled in the art that equivalent self-capacitance embodiments of the present invention may also be realized.

It should be appreciated that the consecutive relevant capacitance changes described above does not need to be time limited to allow the measurement of knob (206)'s rotational movement. This may be advantageous in, for example, a light dimmer application, where the user does not have to execute a specific action within a certain period to obtain a specific light level, as is the case with prior art touch sensor dimmers. Further, for the embodiment shown, knob (206) may be used for relative control actions, as functionality of the knob does not have to be dependent on a specific starting point, but only depends on the rotational distance between a starting and an end point. In other words, in, for example, a light dimming application, the user does not have to return said knob to a specific starting point when turning off the light to be able to use said knob in a certain manner when the light is turned on again. Given the capacitive sensing ability of the exemplary control knob presented in FIG. 20, the present invention further teaches that a user may use touch or proximity gestures to activate the load controlled by said knob. For example, in a lighting application, a user may touch knob (206) briefly to turn a light on, and then select a desired light level by rotating said knob. For example, turning said knob to one side will increase said light level, and conversely, turning it to the other side will decrease said light level. The invention also holds that the knob may incorporate a memory element, allowing an application to return to the last control point, for example a light level, at which the load was deactivated, for example by a touch. Another feature of the disclosed capacitive knob is the ability to realize Find-in-the-Dark (FITD) functionality, although not shown by FIG. 20. To assist a user to locate knob (206) in the dark, the capacitive sensing circuitry of said knob may be used to activate a light emitting device, for instance an LED or electroluminescent element, after detecting a valid proximity or touch gesture. A user may then touch knob (206) to activate a controlled load, for example a light, followed by rotation of said knob to select a specific operating point. Or the user may follow the FITD activation gesture immediately with a rotation of said knob to select a specific operating point for a controlled load, for example a light.

The number of electrodes employed by the capacitive control knob of the present invention need not be constrained to any particular value. For instance, it may be possible to utilize only three electrodes, arranged in a concentric swirl pattern, as is well known in the art of capacitive sensing, below said knob. A conductive or dielectric member is then moved on a circular track above said three electrodes when said knob is turned, influencing the capacitance measured for the three electrodes. This is very much akin to a user's finger moving over the electrodes of said swirl pattern, as is well known in the prior art. Therefore, an capacitive sensing controller like the IQS222 manufactured by Azoteq (Pty) Ltd. may be used to interpret the movement of said knob over said three electrodes arranged in a concentric swirl pattern.

It should further be appreciated that the capacitive sensing circuitry of the control knob disclosed by FIG. 20, and described above, may be part of the capacitive sensing circuitry of a SMPS controller, according to the present invention. This may allow the user to directly control the SMPS supplying power to a load, for example a lighting load, via the capacitive sensing interface of said knob and SMPS controller.

FIG. 21 illustrates yet another exemplary embodiment of the present invention where a Visual User Interface (VUI) indicator is used to provide visual feedback to a user on the operating state of a SMPS which incorporates capacitive sensing, as disclosed earlier. At (222) an exemplary SMPS and controller (224) with capacitive sensing ability is shown. Typically, such a SMPS may be connected to the mains utility network (223), and may be used to process electrical energy with high efficiency to voltage and current levels as required by a load (226). In addition, SMPS (224) incorporates a controller with capacitive sensing ability, for example sensing proximity or touch events at an electrode (227) which are connected to said controller. An LED (225) is controlled by said SMPS controller to provide a VUI to the user, indicating the operating state of said SMPS. It should be noted that member (225) does not have to be an LED, but may be any element capable of providing the relevant visual indication as required. Table (228) lists exemplary parameters and values that may be used by LED (225) to indicate said operating state. If SMPS (224) is in a capacitive sensing only state, with corresponding losses being very small, for example in the micro Watt range, this may be indicated by LED (225) emitting pulsed blue light at a very slow rate. The slow pulse rate for this indication of SMPS operating state may be paramount to ensure that losses stay acceptably low, for example in the micro Watt range. When SMPS (224) detects a valid touch or proximity event via its capacitive sensing interface, or another valid change in its electrical environment, it may go into a low power standby mode, with the SMPS elements actively switching, and the required output voltage provided, but with load current below a predetermined threshold. This state may be indicated by LED (225) through the pulsed emission of for example green light, with the pulse rate still slow, but faster than that of the capacitive sensing only SMPS state. Once load current increases beyond said threshold, LED (225) may turn red, while maintaining its pulse rate, for example, as listed by table (228). As the load current of SMPS (224) increases to a maximum, the pulse rate of LED (225), still emitting red light, may increase correspondingly, for example, as listed by table (228).

In the above manner, according to the present invention, a user may easily ascertain the operating state of a SMPS, and use the capacitive sensing interface to change said operating state if so desired. For example, if SMPS (224) is used to power a light, a user may wish to ascertain that said SMPS is in an operating state with the smallest amount of losses before leaving the house, or going to bed, to conserve power. Or in a charger application, a user may leave a charger plugged in continuously, with a closed mechanical mains switch, for convenience sake. Through a VUI element as disclosed, the user may identify the operating mode of said charger easily and conveniently, and use the capacitive sensing ability of the SMPS in the charger to enter said SMPS into a low loss capacitive sensing only state when the charger is not being used, without the need to unplug said charger, or switch it off via the mechanical mains switch.

In a related exemplary embodiment, illustrated by FIG. 21 at (229), a charger (231) is connected to the mains utility network (230) and incorporates a SMPS with capacitive sensing ability as described during the preceding discourse. A load cable (232) is plugged into a device (236) to be charged, for example a mobile telephone, via a connector (233) and a jack (235), said connector situated at the end of said load cable, and said jack contained by device (236). According to the present invention, a VUI element may be incorporated into connector (233), or at any convenient location along the length of load cable (232), with a visible indication of SMPS operating state emitted by said VUI element, as shown at (234). The VUI element contained by connector (233) is not constrained to the use of an LED. For example, a length of optic fiber may be incorporated into load cable (232), with light being fed into it at the SMPS side, and emitted at the load side, for example via a small plastic lens in connector (233). The functionality of said VUI element shown at (229) may be similar to that listed by Table (228), or different. An embodiment such as shown at (229) may be beneficial if only the load cable of a charger is easily accessible to a user, for example if said charger is plugged into a mains outlet underneath a desk, behind a cupboard or in a location otherwise beyond easy reach. It may also prove advantageous if a large number of products, each with a SMPS that incorporate the present invention, are plugged into a number of adjacent mains outlets, and the user wishes to identify which load cable belongs to which product. By matching the color and pulse rate of a load-cable-end VUI element with another VUI element on the product body, it should prove easy to determine which load cable is connected to which product.

Related to the embodiment shown at (229) is an embodiment of the present invention where optical fiber in said load cable is not only used to emit light to facilitate a VUI for communication of the SMPS operating state, but is also used to perform hybrid optical and capacitive sensing. By connecting the SMPS end of said optical fiber to a light sensing circuit element, for example a photo diode or transistor, and using said element to inject current into or sink current from the capacitive sensing circuit of the SMPS controller, said hybrid sensing may be facilitated. This may be used, for example, to detect when the load cable is plugged into a device, or when a user grips said load cable. One significant advantage of this approach is the possible reduction of electromagnetic interference coupling into said capacitive sensing circuit, improving EMC.

FIG. 22 illustrates an embodiment (239) of the present invention to facilitate dimming of a light source through manipulation of mains switch (237). Light source (242) is shown as an LED bulb, with base (241) containing a SMPS and controller with the ability to detect the points in time where the sinusoidal mains voltages, applied at (239), crosses 0V. That is the controller contained by base (241) has zero-crossing (ZC) detection ability. It should be noted that said light source need not be constrained to LED bulbs, but may be any relevant light source, for example fluorescent lights or even incandescent lights. When mains switch (237) is closed for a first time, power is applied to the SMPS in base (241). If predetermined criteria are met, for example if the mains voltage has been above a specific threshold for more than a minimum period, said SMPS controller will typically allow power to be applied to light source (242). In conjunction, the applied mains voltage is used to store energy in an exhaustible energy store contained within base (241), for example a capacitor. Said exhaustible energy store may be used to power the SMPS controller for a finite period after mains switch (237) has been opened. That is, if the exhaustible energy store contained in base (241) has been fully charged, and mains switch (237) is opened, the SMPS controller will typically remove power from the lighting load, and operate for a finite period on the energy stored within said exhaustible store. If said exhaustible energy store, for example a capacitor, is large enough, the SMPS controller need not remove power immediately from the lighting load, but keep it powered for a finite predetermined period after opening of mains switch (237). In either of the latter cases, said controller uses it ZC-detection ability to sense when mains is present, and when it is absent, be it due to the opening of mains switch (237) or due to other causes. Therefore, if a user opens mains switch (237) and recloses it before said exhaustible energy store is depleted to a level where said controller ceases to be functional, said controller may accurately determine the period between the ZC points directly before opening and after closure of switch (237). This period may be taken as indication of the period that mains switch (237) was open, with a tolerance on the order of one mains cycle. According to the present invention, if the open period of mains switch (237) is less and more than predetermined maximum and minimum values respectively, it may be interpreted as a valid control action. Said control action may be used to activate additional functionality for the light source, as described in detail during the summary of the present invention. For example, if the open period of switch (237) satisfy relevant timing criteria, a gradual dimming of LED light bulb may be started, with a second qualifying open period of switch (237) halting the dimming process at a desired light level. Or said qualifying open period of switch (237) may be used to start an auto-off function, which will, for example, gradually dim a bed light until it is completely turned off.

In an embodiment related to that shown in FIG. 22, a light source with ZC-detection ability, as disclosed above, may be augmented with the ability to detect when the solid state switch of a dimmer circuit external to the light source under consideration is closed, or open, and this information may be used to realize further functionality, as described during the summary of the invention. For example, a user may dim the light emitted by said light source through the use of said external dimmer circuit, and when the light is dimmed below a certain level, the color of the light being emitted may be changed, for example to red. The activation of this functionality may be based on the detection of the period during which the solid state switch of said external dimmer is closed, relative to the detected ZC point of the mains voltage. Further, it may be possible to then use further mains switch open-reclose action cycles, as disclosed before, to change the colored light being emitted below a certain dimming threshold, as an example. Or, as another exemplary embodiment, the user may wish to cancel the transition to colored light below a certain dimming threshold by performing a specific mains switch open-reclose action cycle sequence. The present invention also teaches that some manner of memory element may be used to store user selections, for quick access and activation later, be it via a mains switch close-open-reclose action cycle or cycles, or via the use of a dimmer external to the light source under consideration.

Figure 23:
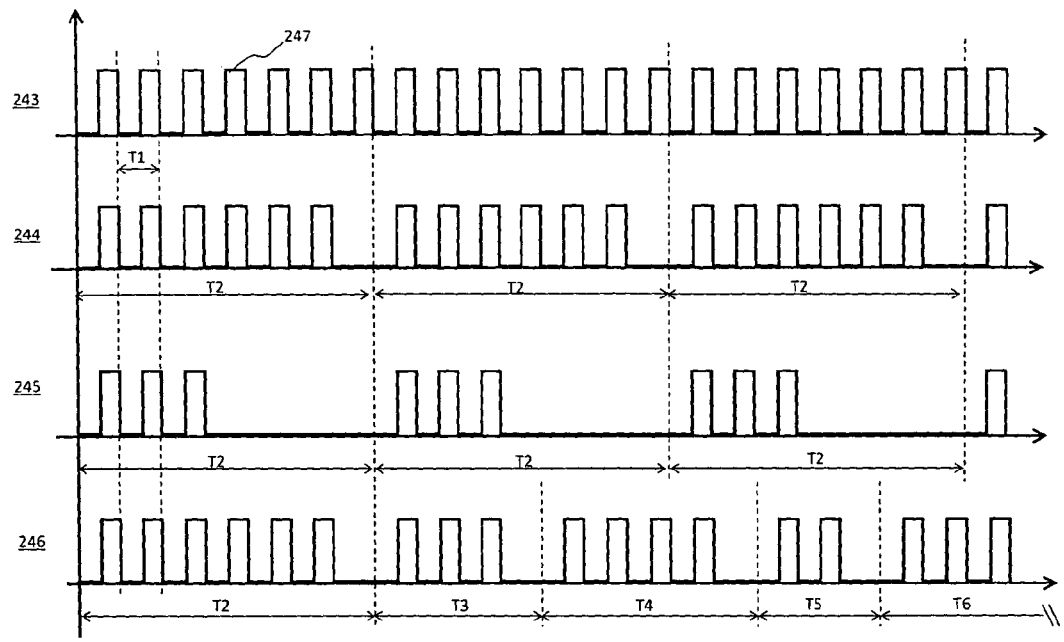
FIG. 23 shows utilization of specific switching cycle skipping patterns to minimize SMPS audible emissions, according to the present invention.

FIG. 23 illustrates exemplary control pulses used to realize dimming of a load placed on a SMPS, for example an isolated fly-back converter and a lighting load. When said control pulses are at their higher level, illustrated at (247), a solid state switch is turned on, resulting in subsequent energy transfer to said lighting load. At (243), a pulse train that will result in a constant light level is shown, with repetition of switching occurring at T1. For example, in a typical fly-back converter, T1 may be on the order of 8 µs, representing a switching frequency of 125 kHz. For pulse train (243), no pulses are skipped, thus the constant load light level. However, if pulses are skipped with a repetition period of T2, as shown at (244), perceived load light level will be lower. As more pulses as skipped, as shown at (245), the perceived load light level will decrease further. Typically, T2 is short enough not to be noticeable to the human eye, with the only noticeable effect to a user being the overall decreased perceived light emission. This is well established in the prior art of light dimming. However, as T2 is increased, its corresponding frequency f2 decreases, and when it approaches the lower kilo Hertz range, dimming as shown at (244) and (245) may result in audible noise, causing a nuisance to users. It should be noted that the number of pulses drawn, and the ratio between T1 and T2, in FIG. 23 is purely for illustration, and should not be construed as an absolute timing diagram. Said audible noise is due to the fact that T2 is constant. According to the present invention, such audible noise due to pulse-skipping dimming may be significantly decreased by varying the repetition frequency at which pulses are skipped, as illustrated at (246). Effectively, this will spread the audible noise over a number of frequencies, resulting in a lower overall noise level. The pattern according which the pulse skipping frequency is varied need not be fixed, and may be quasi or fully random in nature. That is, a quasi-random or random number generator may be used to determine the order by which the pulse skipping repetition frequency is changed. It is envisaged that a method such as illustrated by FIG. 23, and described above, may also be used to improve the electromagnetic compatibility (EMC) of a SMPS.

Figure 24:
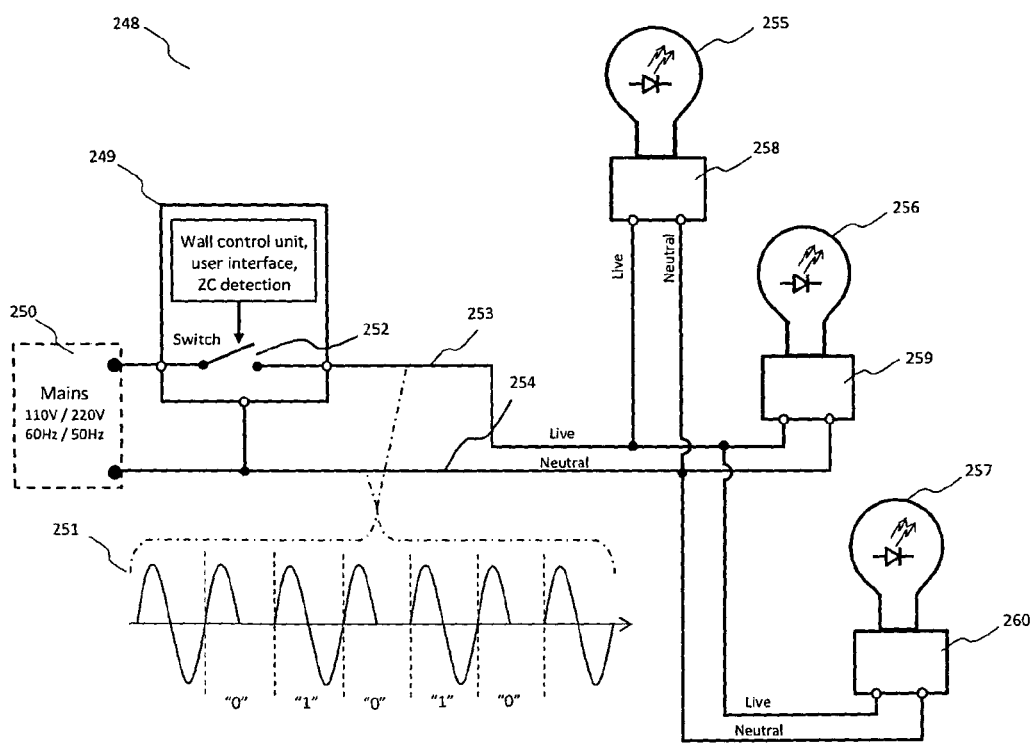
FIG. 24 shows an exemplary embodiment that utilizes a wall control unit with mains cycle omission based communication.

In FIG. 24, another exemplary embodiment of the present invention is presented at (248). A wall control unit (249) is connected to the mains utility network, shown at (250), for example in the place of the normal wall light switch. That is, unit (249) may have the same form factor and mounting holes than the cover plate of a normal wall light switch, and therefore easily replace it. Said wall control unit (249) comprise a user interface, mains ZC-detection ability and some kind of series switching element, shown at (252). Said user interface may for example be a touch or proximity sensing interface, able to sense user touch or proximity gestures performed on or over said interface. Further, the user interface may include some kind of Find-in-the-Dark (FITD) functionality to assist the user with location of unit (249) in low light conditions, for example in the dark. Said FITD functionality may be activated after a relevant user touch or proximity gesture, for example a hand being waved in proximity of unit (249) when the load is switched off, and may constitute a visible indicator, as an example. Said series switching element may be any number of the solid state switching elements known to the art, for example an SCR, a TRIAC or a FET. Control unit (249) is further connected to a number of mains power loads, for example in the embodiment shown to LED bulbs (255), (256) and (257), via mains cabling (253) and (254), respectively carrying Live and Neutral voltages, as is known in the art. Said LED bulbs typically have bases, illustrated at (258), (259) and (260), which contain the SMPS's to convert said mains power to the relevant voltage levels and frequencies, as is required to power the LED elements.

When a user enters a command via the user interface of wall control unit (249), it is interpreted into a relevant digital message, to be communicated over the normal mains cabling to the relevant connected loads, for example to LED bulbs (255), (256) and (257) in the embodiment illustrated in FIG. 24. The modulation used for said communication may be based on the omission of mains cycles or half-cycles in the power applied to said load, and on ZC-detection ability, as illustrated in exemplary manner at (251). The omission of a given mains half-cycle or cycle may be achieved through the opening of series switching element (252) during a particular ZC event, and reclosing it during the subsequent or a later ZC event. In the example shown at (251), a digital zero is represented by the omission of a negative half-cycle, and a digital one by a complete mains cycle without any omissions. Said LED bulbs (255), (256) and (257) have both ZC-detection ability, and the ability to demodulate messages communicated in the above manner, and to act accordingly. Typically, circuitry to realize said abilities may be contained within LED bulb bases (258), (259) and (260). For example, said wall control unit may communicate an instruction to a particular LED bulb, or to a number or bulbs, or to all bulbs connected, to dim emitted light to a specific level, or to change the color of the light being emitted. Naturally, a very large number of possible commands and functionalities are possible. In the exemplary embodiment illustrated, three LED bulbs are connected to one wall control unit. Each bulb may have its own digital address, and will typically react on a given command if preceded or followed by said address. It may also be possible for wall control unit (249) to communicate general commands, without the need for addressing, with all connected receiving units required to act if relevant.

Figures 25, 26:
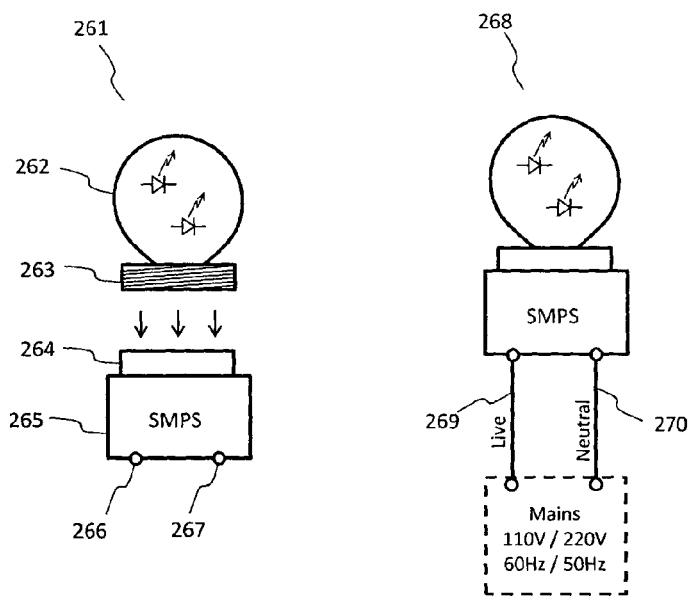
FIG. 25 shows an exemplary embodiment where an LED bulb may be separate into two parts, a light-head and a SMPS-base.
FIG. 26 shows an exemplary embodiment where constant load current control is used to for the SMPS of an LED bulb as presented by FIG. 25, to allow the fitment of light-heads with varying numbers of LED elements.

FIG. 25 illustrates another exemplary embodiment of the present invention, where an LED bulb (261) may be separated into a light-head part and a SMPS-base part. Said light-head part consists of a light emitting member (262) and a SMPS-base engaging member (263). Member (262) may typically contain a number of light emitting elements, such as, but not limited to, LED's. Said SMPS-base consists of light-head engaging member (264), a SMPS part (265), which may comprise a SMPS and controller according to any of the large number of relevant topologies known to the arts of power electronics and solid state lighting, and mains terminals (266) and (267). The latter two members will typically be constructed in such a manner as to conform to standards set for mains powered lighting bulbs. As shown at (268), said light-head member (263) engages said SMPS-base member (264) in a manner as to form an integral unit, which will nominally be powered from Live (269) and Neutral (270) connections, with either 110V or 220V applied at a mains cycle frequency of 50 Hz or 60 Hz. As disclosed during the summary of the present invention, a number of contacting terminal types may be used to electrically connect said light-head to said SMPS-base, for example, but not limited to, blade connectors and screw type connectors, amongst others. The present invention also teaches that a standard mechanical interface should be defined for the terminals between said light-head and said SMPS-base.

In said light-head, member (263) is not only used to engage said SMPS-base to form a mechanically integral unit, but also to transfer heat as generated by said lighting elements. In a preferred embodiment, said SMPS-base will contain a heat sink, which may for example be part of member (264). Member (263) couples thermally to said heat sink, to transfer the heat generated by said lighting elements, which is then radiated in an effort to ensure that no part of said LED bulb have a temperature above that which will result in permanent damage. It is imperative, according to the present invention, to have good thermal coupling between said light-head and said SMPS-base. Further, the present invention teaches that the lighting elements contained by member (262) may be electrically isolated from said heat sink. This may allow the use of SMPS topologies which are not isolated from the mains network, and which may be much more cost effective. In other words, if said lighting elements are powered via non-isolated circuitry, but they are isolated from said heat sink, a user may safely touch said heat sink without danger of electrical shock. Said isolation may be facilitated by either isolating said lighting elements from member (263), or using electrical insulation between member (263), situated in the said light-head, and member (264), situated in the base. The latter approach will only work if the user cannot access and touch member (263) during insertion of said light-head, and if said electrical insulation has good heat transfer properties. The present invention further teaches that the SMPS will disable it's output to relevant terminals between said light-head and said SMPS-base when no light-head is detected, in order to reduce power consumption, and to prevent users from potentially touching mains voltages, or voltages referred thereto. A number of detection schemes was disclosed during the summary of invention, and will not be repeated here.

According to the present invention, light-heads with varying power levels may be used with the same SMPS-base. One method to facilitate this is shown in FIG. 26. An exemplary circuit schematic for a typical light-head as disclosed earlier is shown at (271). Terminals (272) and (274) are used to connect to a SMPS-base, as described earlier. The SMPS output voltage, in this case a transformer secondary derived voltage (273), is applied to said terminals, resulting in said voltage also being applied to the series combination of three LED's (278), (279) and (280) and current sensing resistor (276). If said output voltage is of sufficient magnitude, current will flow through said LED's and said resistor. This will result in a voltage being developed over the current sensing resistor (276), between node (277) and circuit ground (275), with said voltage directly proportional to the current flowing though said LED's, where the value of resistor (276) is the constant of proportionality. The voltage between nodes (277) and ground (275) may first be filtered by a low-pass filter (282) before being fed back to the SMPS controller via terminals (286) and (285), as signal (287). The input impedance between nodes (277) and ground (275), towards nodes (285) and (286) will typically be fairly high, to ensure that negligible LED current is diverted from current sensing resistor (276). Low-pass filter (282) may typically consist of an impedance (283), which may be a resistor or an inductor, and a capacitive element (284) in parallel. Such detection or measurement of the current through a series combination of LED's, and feedback of the resultant signal to a SMPS or other controller is well known in the art. However, the present invention teaches that this technique may be used to facilitate light-heads for an LED bulb, or another light source, with varying number of lighting elements that can be driven from the same SMPS-base, as discussed. If the SMPS contained by said SMPS-base is controlled to maintain a specific current through sense resistor (276), a user may connect, for example, a light-head with three LED's, as shown at (271), or one with four LED's, as shown at (288), or one with five LED's, as shown at (289), with the same current flowing through all three series combinations illustrated. If the LED elements are similar, the user will therefore increase the amount of power consumed, and thus the amount of light emitted, in each case, without needing a new SMPS-base.

The present invention also teaches that light-heads which emit different colors may be connected to the same SMPS-base, in an LED bulb, or another light source. The same constant current control technique as discussed above, and illustrated by FIG. 26, may be used to ensure that current through the color LED elements remains constant. Depending on the color LED's used, this may result in more or less light being emitted. Further, it is also within the scope of the present invention to have LED bulb, or another light source, with light-heads which can provide Red-Green-Blue (RGB) combinations of light, and where the same SMPS-base may use to power a light-head which only emits white light, or one which emit a single color other than white light, or one which emits some RGB combination of light.

Figure 27:
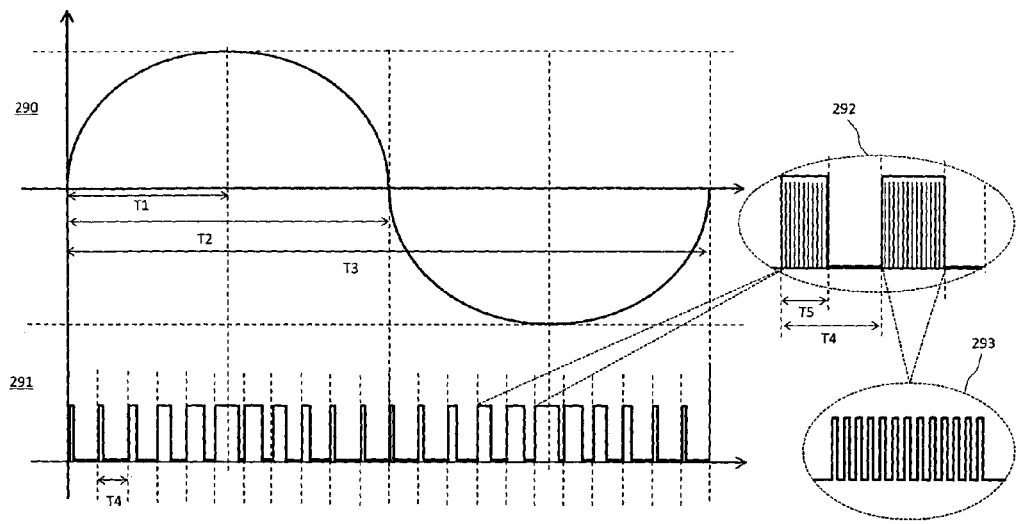
FIG. 27 shows exemplary waveforms for an embodiment where power factor of SMPS is improved through PWM of a switching blanking waveform.

FIG. 27 shows waveforms of an exemplary embodiment of the present invention where PWM of blanking of SMPS switching pulses is used to improve Power Factor (PF). It should be noted that the diagrams are of an illustrative nature, and not absolute timing diagrams. Mains voltage is shown at (290), with a period T3, and quarter and half-cycle periods of T1 and T2 respectively. A blanking waveform according to the present invention, as is imposed on the switching pulses of said SMPS, is shown at (291), with a blanking waveform period of T4. A section of said blanking waveform is shown in enlarged format at (292). When the blanking waveform is high, during period T5, the SMPS is allowed to turn switching elements on and off, resulting in switching pulses, as is typically illustrated in the further enlarged view shown at (293). However, when the blanking waveform shown at (291) is at a low level, during the remainder of period T4 at (292), the SMPS is not allowed to switch, resulting in no power being transferred during this period. When waveforms (290) and (291) are compared, it is evident that the present invention teaches that the most blanking to the switching of said SMPS is applied when mains voltage is at a minimum, that is, close to its ZC points. As mains voltage rises to it maximum, attained after period T1, the amount of blanking imposed becomes proportionally less. At T1, the most switching by said SMPS is allowed, resulting in the most power being transferred by said SMPS. After T1, the amount of blanking imposed increases again as the mains voltage (290) decreases, until a maximum of blanking is again imposed at the ZC point after a period T2 has elapsed. The blanking waveform as described repeats thereafter for each mains half cycle period, as shown. The present invention teaches that such PWM of a blanking waveform improves the PF drawn, due to the fact that the most power is transferred by the SMPS when the mains voltage is at a maximum, and the least when said voltage is at a minimum. This avoids large currents being drawn by the SMPS when said mains voltage is low, thereby improving PF.

Figure 28:
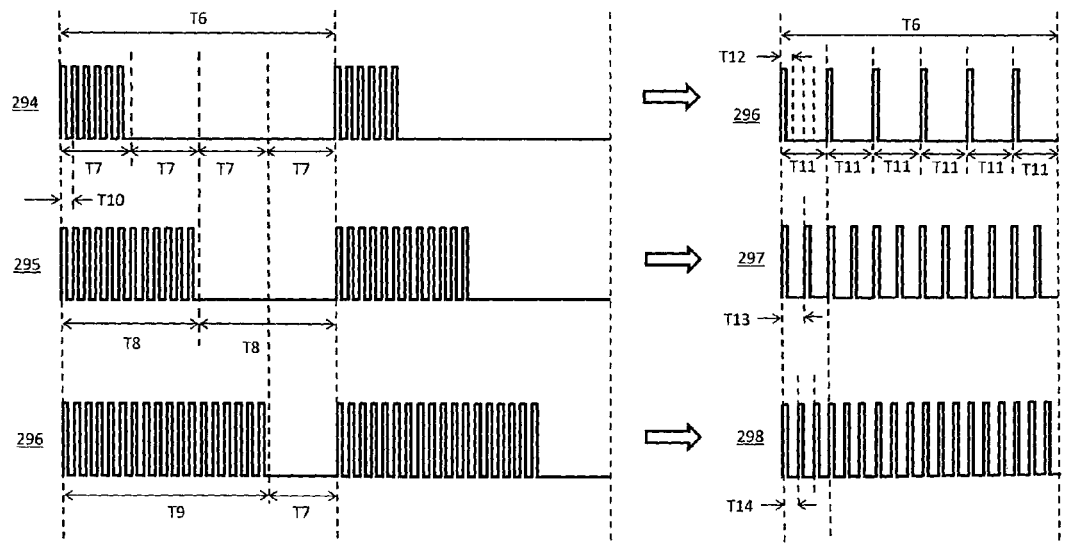
FIG. 28 shows exemplary waveforms for an embodiment which reduces SMPS audible emissions by spreading switching pulses evenly and decreasing the maximum blanking period as far as possible.

FIG. 28 illustrates exemplary waveforms of yet another embodiment of the present invention, where SMPS audible emissions due to the use of a blanking waveform, as described above, are reduced. Once again, it should be noted that said waveforms are of an illustrative nature, and should not be conceived to be absolute timing diagrams. SMPS switching waveforms for various pulse widths of blanking waveforms are shown at (294), (295) and (296), where, for example, the waveform at (294) is blanked for 75% of period T6, the waveform at (295) is blanked for 50% of period T6 and the waveform at (296) is blanked for 25% of period T6 respectively. If the inverse of periods T6-T9 falls within the frequency band which is audible to humans, said SMPS may have audible emissions, which may inconvenience users of the product which contain said SMPS. According to the present invention, it may be possible to overcome this obstacle by spreading the blanking more evenly over period T6, while maintaining the same amount and width of SMPS switching pulses, as is illustrated at (296) to (298). For example, at (296), the six switching pulses of (294) have been spread out over period T6, resulting in the same amount of power transferred by said SMPS over period T6. However, the effective blanking waveform period has been reduced to T11, which is much shorter than T6, and should reduce audible emissions substantially. In a similar manner, the exemplary SMPS switching pulse waveforms shown at (297) and (298) will result in the same amount of power being transferred over period T6, relative to (295) and (296) respectively, but the blanking waveform periods have been significantly reduced in length to T13 and T14, respectively.

So for example if a 128 state (7 bit) PWM structure is used to dim the SMPS output, it is taught here that the slots in the 128 state block is not blanked from one side until the lowest level is reached, but rather the blanks are always inserted to achieve the smaller maximum off period between transformer switching pulses.

Figure 29:
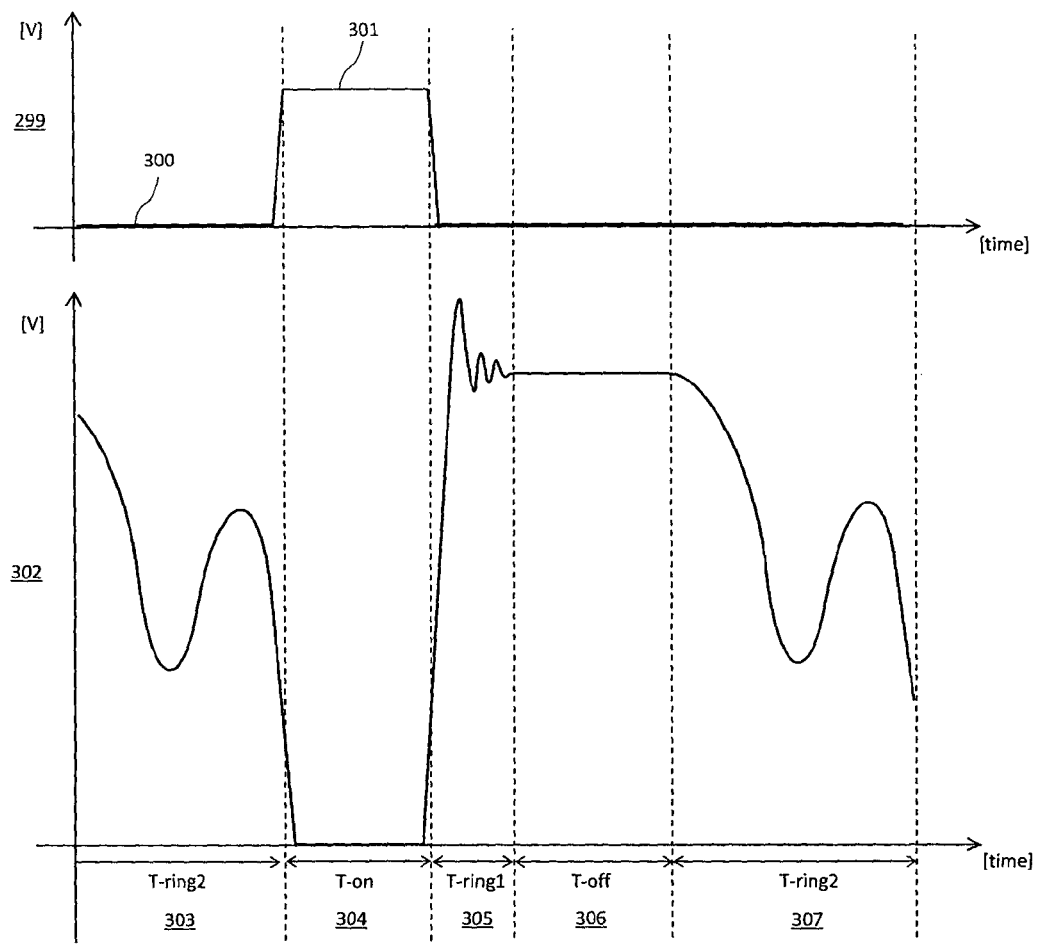
FIG. 29 shows exemplary waveforms that illustrate how Signal to Noise Ratio of capacitance measurements may be improved by taking switching element signal stability into account.

In FIG. 29, qualitative waveforms for a SMPS are shown. At (299), a typical voltage waveform for the control of the main switching element or elements in said SMPS is shown, with a typical waveform for the voltage across said main switching element or elements shown at (302). For example, the main switching element or elements may be a MOSFET, with the waveform at (302) representing the drain-source voltage, and the waveform at (299) being the gate voltage. At (300), the voltage of said gate signal is below a specific threshold, for example it is equal to zero volts. Therefore, the main switching element is turned off, and no-current is conducted by it. Once the gate signal increases beyond a certain threshold, said main switching element will be turned on, and conduct current. If the voltage of the gate signal is maintained above this threshold, such as at (301), the on-state of the main switching element or elements will be maintained. This is also evident from the low drain-source voltage at (304). If the gate signal falls below said threshold again, said main switching element will turn off, as illustrated, with a subsequent rise in the voltage across said switching element. Due to switch current also flowing through inductances during period (304), the turn-off event may cause an amount of overshoot and ringing in the voltage across said main switching element or elements, as are shown in period (305). The ringing will decay according to the amount of energy stored in said inductances and the amount of damping present in the ringing current path. In the example shown, this decay happens fast enough to allow a period (306) where the voltage across the main switching element is stable. This may be followed by a period of lower frequency ringing, as shown at (307), and also at (303). To increase the Signal-to-Noise Ratio (SNR) of the capacitance measurement done by the microchip which also controls said SMPS, as disclosed earlier, the present invention teaches that said capacitance measurements should be done during periods when said main switching element voltage is fairly stable. That is, according to the present invention, the capacitance measurement SNR can be increased if measurement is done during periods (303) and (307) (T-ring2), during period (304) (T-on) and during period (306) (T-off). The amount of SNR variation between the different periods listed may be dependent on a large number of factors, for example the location of sense plate or electrode structures, proximity to said main switching element, layout and so forth. Therefore, the present invention further teaches that said microchip which controls said SMPS, and also perform said capacitance measurements, may be configurable in terms of which switching period is used for capacitance measurements, with various combinations of selected periods possible.

The invention claimed is:

1. A microchip for use in a switch mode power supply (SMPS) circuit, wherein said SMPS circuit is used to convert alternating current (AC) power to direct current (DC) power in order to energize a load, wherein said microchip is a controller for and connected to said SMPS circuit and characterised in that said microchip also comprises Charge Transfer (CT) measurement circuitry, and wherein said CT measurement circuitry is active and powered from the AC power through a secondary power supply circuit when the SMPS circuit is in an inactive state, and wherein measurements by said CT measurement circuitry are used to determine a condition for activation of said SMPS circuit.

2. The microchip of claim 1, wherein said CT measurement circuitry is connected to a sensor, wherein said microchip monitors for a predetermined change in a parameter being measured with the sensor and the CT measurement circuitry, and wherein a detection of said change is used by the microchip to determine a condition for activation of said SMPS circuit.

3. The microchip of claim 2, wherein said sensor is an electrode or sense plate structure, and said parameter is a capacitance of said electrode or sense plate structure.

4. The microchip of claim 2 wherein said SMPS circuit includes at least one main switching element and wherein the microchip uses a count of state changes of said at least one switching element or elements of said switch mode power supply within a limited period to monitor said load, and wherein load status is used in conjunction with said measured parameter to determine a condition for SMPS circuit activation or deactivation by said microchip.

5. The microchip of claim 4, wherein said SMPS circuit is used in a product, and wherein said microchip enters said SMPS circuit into an inactive state due to at least one of the following:
 a) said microchip detects that said load is less than a predetermined minimum;
 b) an indication given by said product to said microchip; and
 c) user touch or proximity gestures discerned by said microchip from CT measurements of an electrode or sense plate structure capacitance, wherein said electrode or sense plate structure functions as said sensor.

6. The microchip of claim 2, wherein said SMPS circuit includes at least one main switching element, wherein said parameter measurement is not performed during periods when said at least one switching element is changing from an open state to a closed state, or vice versa, or during voltage transients resulting from said state change.

7. The microchip of claim 2 wherein said load is a light generating element, and wherein an amount of light emitted by said element is directly controlled by said SMPS circuit controller according to user touch or proximity gestures detected by said microchip on or in the vicinity of an electrode or sense plate structure, wherein said electrode or sense plate structure functions as said sensor, and wherein said detection is based on changes in a capacitance of said electrode or sense plate structure measured by said CT measurement circuitry of said microchip.

8. The microchip of claim 7 wherein a detection of user proximity to a product by said microchip causes it to activate a Find-in-the-Dark indicator, said indicator powered via said secondary power supply circuit or via an output of said SMPS circuit, and wherein said light generating element is activated by said microchip if it detects a user touch gesture within a predetermined period after said proximity detection, wherein the amount of light emitted by said element is controlled by said microchip according to user touch sequences detected by said microchip, and wherein a housing of said product is used as said electrode or sense plate structure for said proximity detection.

9. The microchip of claim 2 wherein said SMPS circuit is used with two or more light generating elements as loads in a product, and wherein amounts of light emitted by said elements are directly controlled by said SMPS circuit controller, said control based on user effected changes in said measured parameter, and wherein at least one of said elements emits white light, and at least one of said elements emits coloured light, and wherein said controller can control all loads separately or simultaneously, and wherein said controller optimizes SMPS circuit operation based on selected light sources and the amount of light emitted.

10. The microchip of claim 2 wherein a cable between said load and said SMPS circuit is used as said sensor, and wherein said parameter is a capacitance of said cable.

11. The microchip of claim 10 wherein projected- or self-capacitance is measured.

12. The microchip of claim 1, wherein said microchip utilizes an improved Signal to Noise Ratio, in terms of CT measurements, achieved when the switch mode power supply circuit is inactive and power is only supplied via said secondary power supply circuit, for selecting a further action.

13. The microchip of claim 12 wherein more than one rectifying path is used to convert an AC voltage to a DC voltage, with a first rectifying path using a full-wave diode bridge and said SMPS circuit, and wherein a second rectifying path uses a full- or half-wave diode bridge and a structure that is not a SMPS circuit to supply power to said microchip, by causing a sufficient voltage drop over at least two capacitors in series with diodes of said second rectifying path, and wherein the DC-blocking ability of said capacitors allows the grounds of said first and said second rectifying paths to be connected.

14. The microchip of claim 1 wherein the secondary power supply circuit, which is not a SMPS circuit, consumes less power than said SMPS circuit.

15. The microchip of claim 1, wherein data relevant to the control of said SMPS circuit by said controller is transferred across an isolation barrier in said SMPS circuit, and characterised by the use of said CT measurement circuitry to demodulate said data after said transfer.

16. The microchip of claim 1, wherein said microchip keeps a DC voltage bus in an active state when said SMPS circuit is in an inactive state, and wherein said active state of said DC bus allows said controller to decrease the time required to return said SMPS circuit to an active state.

17. The microchip of claim 1, wherein said load is a light generating element, wherein said CT measurement circuitry is connected to a sensor, wherein said microchip monitors for a predetermined change in a parameter being sensed by said sensor, and wherein detection of said change affects the control of said load by said microchip.

18. The microchip of claim 1 used in a product, wherein said load is a light generating element, and wherein a first signal proportional to the operating temperature of said product is fed back to said microchip, and wherein said first signal is used in conjunction with or apart from a second signal, said second signal being proportional to a current flowing through said load, to control the operation of said SMPS circuit.

19. The microchip of claim 1, wherein said load is a light generating element, and wherein said microchip receives commands, wherein said commands are remotely generated and communicated to said microchip, and wherein execution of said commands by said microchip results in an operation change for the load.

* * * * *